(12) United States Patent
Yao et al.

(10) Patent No.: US 11,462,237 B2
(45) Date of Patent: Oct. 4, 2022

(54) DEEP LEARNING BASED METHOD AND SYSTEM FOR PROCESSING SOUND QUALITY CHARACTERISTICS

(71) Applicant: Anker Innovations Technology Co. Ltd., Changsha (CN)

(72) Inventors: Qingshan Yao, Shenzhen (CN); Yu Qin, Shenzhen (CN); Haowen Yu, Shenzhen (CN); Feng Lu, Shenzhen (CN)

(73) Assignee: Anker Innovations Technology Co., Ltd., Changsha (CN)

( * ) Notice: Subject to any disclaimer, the term of this patent is extended or adjusted under 35 U.S.C. 154(b) by 30 days.

(21) Appl. No.: 17/114,349

(22) PCT Filed: Jun. 3, 2019

(86) PCT No.: PCT/CN2019/089755
§ 371 (c)(1),
(2) Date: Dec. 7, 2020

(87) PCT Pub. No.: WO2019/233358
PCT Pub. Date: Dec. 12, 2019

(65) Prior Publication Data
US 2021/0264938 A1    Aug. 26, 2021

(30) Foreign Application Priority Data

Jun. 5, 2018  (CN) .......................... 201810583119.4

(51) Int. Cl.
*H04R 29/00*   (2006.01)
*G10L 25/60*   (2013.01)
(Continued)

(52) U.S. Cl.
CPC ............... *G10L 25/60* (2013.01); *G06N 3/04* (2013.01); *G06N 3/08* (2013.01); *G10L 21/007* (2013.01); *G10L 21/0232* (2013.01); *G10L 25/30* (2013.01)

(58) Field of Classification Search
CPC ....................................................... H04R 29/00
See application file for complete search history.

(56) References Cited

U.S. PATENT DOCUMENTS

2016/0149547 A1* 5/2016 Rider ................... H03G 3/3005
                                                                381/57
2017/0070817 A1   3/2017 Seo et al.
(Continued)

FOREIGN PATENT DOCUMENTS

CN       102654860 A      9/2012
CN       103037100 A      4/2013
(Continued)

OTHER PUBLICATIONS

Aug. 27, 2019 (WO) International Search Report—App. PCT/CN2019/089755.
Mar. 10, 2020 (CN) Office Action—App. 201810583119.4.
Sep. 1, 2020 (CN) Office Action—App. 201810583119.4.

*Primary Examiner* — Olisa Anwah
(74) *Attorney, Agent, or Firm* — Banner & Witcoff, Ltd.

(57) ABSTRACT

The present invention provides a deep learning based method and system for processing sound quality characteristics. The method comprises: obtaining data characteristics of an audio data to be processed by extracting features from user preference data including the audio data to be processed; based on the data characteristics, generating a sound quality processing result of the audio to be processed by using a trained baseline model; wherein the baseline model
(Continued)

is a neural network model trained by using audio data behavioral data, and other relevant data from multiple users or a single user.

20 Claims, 9 Drawing Sheets

(51) Int. Cl.
*G06N 3/04* (2006.01)
*G06N 3/08* (2006.01)
*G10L 21/007* (2013.01)
*G10L 21/0232* (2013.01)
*G10L 25/30* (2013.01)

(56) References Cited

U.S. PATENT DOCUMENTS

| | | | | |
|---|---|---|---|---|
| 2019/0052967 A1* | 2/2019 | Kim | ............... | H04R 5/04 |
| 2019/0196777 A1* | 6/2019 | Kovacevic | ............... | H04R 5/04 |

FOREIGN PATENT DOCUMENTS

| | | | |
|---|---|---|---|
| CN | 103186527 | A | 7/2013 |
| CN | 106528035 | A | 3/2017 |
| CN | 106855876 | A | 6/2017 |
| CN | 107078706 | A | 8/2017 |
| CN | 107274883 | A | 10/2017 |
| CN | 109147804 | A | 1/2019 |
| JP | 2010192995 | A | 9/2010 |
| JP | 2016178587 | A | 10/2016 |

\* cited by examiner

DEEP LEARNING BASED METHOD AND SYSTEM FOR PROCESSING SOUND QUALITY CHARACTERISTICS

BACKGROUND OF INVENTION

Cross Reference to Related Application

This application is a national stage application, filed under 35 U.S.C. § 371, of International Application No. PCT/CN2019/089755, filed on Jun. 3, 2019, which claims priority to Chinese Application No. 2018105831194, filed on Jun. 5, 2018. The entire disclosures of each of the above applications are incorporated herein by reference.

Field of Invention

The present invention relates to the field of sound quality processing technology, specifically to a deep learning based method and system for processing sound quality characteristics.

Description of Prior Art

Sound quality is a subjective evaluation of audio quality, and everyone has different preferences on sound quality. One of the most direct ways to improve user's listening experience is to improve and enhance sound quality of audio, whether it is from audio playback equipment suppliers or audio portal platforms. However, at present, with incomplete indicator models of sound quality evaluation, not only those indicators that cannot be objectively quantified are unreconcilable, even reconcilable sound quality characteristics are difficult to personalize automatically due to each individual has different sound quality preferences.

In current sound quality adjustment methods, sound quality is usually adjusted by user himself. which are not friendly to the user, and lack of adaptive sound quality adjustment methods for specific audio pair characteristics or user preferences. In other approaches, title, author, and other tag features of the music are analyzed, user preference was matched with one or more music types by using music recommendation algorithm, then existing popular sound settings that match the style is recommended to the user.

However, for music with multiple types or unknown types, this sound quality adjustment method is difficult to apply because the data needs to be manually annotated. Once offline, it would be difficult to obtain information other than an audio waveform, such as music style, user comments, and other parameters used in recommendation algorithms, and that's when this method fails.

In summary, the main problems in the prior art include:

First, most sound quality adjustment method cannot be automatically adjusted, especially lacks of personalized sound quality adjustment techniques for individual users.

Second, using existing styles or types of empirical data, such as Equalizer (EQ), to adjust sound quality makes this method cannot be used for music with unknown types. For music with multiple types, this method cannot combine multiple empirical data, and relies on manual evaluation information online.

Third, other ways are needed to restore audio information from artificial damage.

Fourth, correlation of quantifiable sound quality characteristics and subjective user perception are needed to enhance sound quality.

Fifth, methods are needed to process properties of unknown quantization.

SUMMARY OF INVENTION

The present invention is proposed in order to solve at least one of the above problems. The present invention provides a solution for processing sound quality characteristics based on deep learning, and processing online model learning based on user feedback data to achieve user personalized sound quality adjustment. The present invention also divides the sound quality characteristics into multiple categories according to quantification method of sound quality index, data acquisition method, signal domain characteristics and other dimensions, and designs specific sound quality adjustment models according to the characteristics of each category. For existing known sound quality metrics, sound quality adjustment and user customization are possible. For unknown sound quality indicators, they could be trained and adjusted according to existing framework based on the category their nature belongs to. For unknown sound characteristics that cannot be attributed to current categories, the framework can be extended to cover all sound characteristics.

According to one aspect of the present invention, a deep learning based method for processing sound quality characteristics, wherein comprises:

obtaining data characteristics of an audio data to be processed by extracting features from user preference data including the audio data to be processed;

based on the data characteristics, generating a sound quality processing result of the audio to be processed by using a trained baseline model;

wherein the baseline model is a neural network model trained by using audio data behavioral data, and other relevant data from multiple users or a single user.

The user preference data comprises data reflecting user's preference for the sound quality characteristics.

The user preference data comprises at least one of user behavior data, user audio list data, audio data in playback, ambient noise data, and device data, and other parameter data.

The method of feature extraction comprises at least one of FFT, STFT, MFCC, one or more frames of a time-domain waveform, and other artificially designed features.

The data characteristics comprise time domain and/or frequency domain characteristics.

The method for training the baseline model comprises:

obtaining data characteristics of a trained data by extracting features based on the trained data, and training the baseline model by using the data characteristics as input layer data, using characteristics reflecting the sound quality characteristics as output layer data; or extracting features of the user preference data, and obtaining the baseline model by using an unsupervised deep learning method.

The sound quality characteristic comprises characteristics relating to empirical fusion, artificial damage, sound quality feedback, empirical formula adjustment, signal domain calculation, noise, and/or other sound quality characteristics.

Training the baseline model of sound quality characteristics relating to empirical fusion comprises:

extracting category tag features and data characteristics of the audio data based on an audio database;

training to obtain a baseline model relating to empirical fusion by using the data characteristics of the audio data as input layer data, and using the category tag features as output layer data.

Training the baseline model of sound quality characteristics relating to artificial damage comprises:

artificially processing high-quality original audio data samples of audio databases to obtain low-quality lossy audio data samples; extracting features of the high-quality original audio data samples and the lossy audio data samples respectively to obtain low-quality lossy audio data characteristics and high-quality original audio data characteristics;

training to obtain a baseline model relating to artificial damage by using the low-quality lossy audio data characteristics as input layer data and using the high-quality original audio data characteristics as output layer data.

Training the baseline model of sound quality characteristics relating to sound quality feedback comprises:

extracting features based on environmental data of multiple user audio data and behavioural data corresponding to the environmental data respectively to obtain environmental data characteristics of the environmental data and sound quality setting characteristics of the behavioural data;

training to obtain a baseline model relating to artificial damage by using the environmental data characteristics as input layer data and using the sound quality feedback as output layer data.

Training the baseline model of sound quality characteristics relating to empirical formula adjustment comprises:

extracting features from audio data in the audio database to obtain original data features;

adjusting the sound quality of the audio data and extracting features from the audio data after adjustment to obtain adjustment characteristics, establishing a network model that maps the adjustment features to subjective evaluation through subjective evaluation experiments to obtain optimized sound quality adjustment parameters;

training to obtain a baseline model relating to artificial damage by using the original data features as input layer data and using the optimized sound quality adjustment parameters as output layer data.

Training the baseline model of sound quality characteristics relating to signal domain calculation comprises:

extracting based on audio data from the audio database to obtain sound quality characteristics;

clustering the sound quality characteristics to obtain a clustering model;

extracting features based on audio data preferred by a user to obtain sound quality characteristics of the preferred audio data, inputting the obtained sound quality characteristics into the clustering model to generate a vector of sound quality characteristic distributions preferred by the user;

training to obtain an unsupervised neural network model as the baseline model relating to signal domain calculation based on the vector of sound quality characteristic distributions preferred by the user.

Training the baseline model of sound quality characteristics relating to noise comprises:

extracting features based on the audio data in the audio database containing the noise or normal sound category tag features to obtain data features and corresponding category tag features;

training to obtain a classification baseline model relating to noise based on the data features and corresponding category tag features.

The method further comprises:

processing the audio data to be processed based on noise discrimination result of the classification baseline model relating to noise; if the results of the noise discrimination shows that the noise is filterable, a trained noise reduction baseline model is used to obtain a noise-reduced audio data; if the results of the noise discrimination shows that the noise is non-filterable, a notice is sent to the user to delete the audio data to be processed.

Training the baseline model of other sound quality characteristics comprises:

obtaining audio data reflecting other sound quality characteristics directly or indirectly based on the audio database;

extracting features based on the audio data reflecting other sound quality characteristics to form a model to extract features from other sound quality characteristics, and then obtaining features of other sound quality characteristics;

training to obtain a baseline model relating to other sound quality characteristics by using the features of other sound quality characteristics as input layer data, and using subjective perception evaluation obtained by mapping other sound quality characteristics to a network model of subjective evaluation as output layer data, or based on user preferred features of other sound quality characteristics.

According to another aspect of the present invention, a deep learning based method for individually processing sound quality characteristics is provided, wherein comprises:

extracting preference data of an individual user in real time;

training to obtain an personalized sound quality characteristic processing model based on a baseline model of sound quality characteristics by learning the preference data of the individual user online;

generating a personalized sound quality processing result by using the personalized sound quality processing model;

wherein the baseline model is a neural network model trained by using audio data behavioral data, and other relevant data from multiple users or a single user.

The user preference data comprises data reflecting user's preference for the sound quality characteristics.

The user preference data comprises at least one of user behavior data, user audio list data, audio data in playback, ambient noise data, and device data, and other parameter data.

The method for training the baseline model comprises:

obtaining data characteristics of a trained data by extracting features based on the trained data, and training the baseline model by using the data characteristics as input layer data, using characteristics reflecting the sound quality characteristics as output layer data; or extracting features of the user preference data, and obtaining the baseline model by using an unsupervised deep learning method.

The method of feature extraction comprises at least one of FFT, STFT, MFCC, one or more frames of a time-domain waveform, and other artificially designed features.

The data characteristics comprise time domain and/or frequency domain characteristics.

The online learning method comprises:

outputting sound quality characteristics processing results based on the baseline model, and updating the baseline model to obtain a personalized sound quality characteristics processing model based on feedback data from individual users on the sound quality characteristics processing results; and/or learning individual user's feedback data on personalized sound quality characteristics processing results, updating current personalized sound characteristic processing model, and obtaining a new updated personalized sound quality characteristic processing model.

The online learning method further comprises: when a number of individual user feedback behaviors in user behavior data accumulates to a predetermined value, relearning the baseline model or current personalized audio sound quality model based on the individual user preference data.

The sound quality characteristic comprises characteristics relating to empirical fusion, artificial damage, sound quality feedback, empirical formula adjustment, signal domain calculation, noise, and/or other sound quality characteristics.

The online learning method of sound quality characteristics relating to empirical fusion comprises:

when a user preferred list in the user preference data is updated, fusion results of sound quality characteristics parameters are updated, and the baseline model is not updated; and/or when data characteristics of the sound quality characteristics changed after user feedback, the baseline model is retrained based on the data characteristics of the sound quality characteristics after user feedback to obtain a personalized sound quality characteristics processing model relating to empirical fusion.

The online learning method of sound quality characteristics relating to artificial damage comprises: determining audio format of audio data in the user preference data, and prompting user to download, or automatically downloading a corresponding baseline model; training a hybrid model suitable for multiple audio format enhancements based on the downloaded baseline model to obtain a personalized sound quality characteristics processing model relating to artificial damage.

The online learning method of sound quality characteristics relating to sound quality feedback comprises:

the baseline model or current personalized sound quality characteristic processing model outputs sound quality characteristic processing results based on environmental parameter information of the current audio data, and updates the baseline model, or the current personalized sound quality characteristic processing model, based on user feedback training with the output sound quality characteristic processing results, to form a personalized sound quality characteristics processing model relating to sound quality feedback.

The online learning method of sound quality characteristics relating to empirical formula adjustment comprises:

processing the audio data to be processed with processing parameters output from the baseline model or current personalized sound quality characteristics processing model, if the user accepts, the baseline model or current personalized sound quality characteristics processing model does not need to be updated; if the user does not accept, the processing parameters for the output are adjusted, then the baseline model or current personalized sound quality characteristics processing model are adjusted with the adjusted audio data and processing parameters.

The online learning method of sound quality characteristics relating to signal domain calculation comprises:

using an encoder to calculate matching degree between an encoding of the audio quality characteristic of an audio data to be recommended and an encoding dataset of the audio quality characteristic preferred by the individual user, sending audio data with highest matching degree with predetermined number to the individual user, and recommending one or more audio data to the user; if the user accepts the recommended audio data, the audio data is considered to be the audio data preferred by the user and to be added to the individual user preferences; using the updated audio data of the individual user preferences to update the encoder.

The online learning method of sound quality characteristics relating to noise comprises: if a user hates or frequently encounters a certain class of noise, customizing a dedicated classifier or denoiser for that class of noise for the user through user feedback information.

The online learning method of other sound quality characteristics comprises: the method of online learning of the other classes of sound quality characteristics applicable as described above, with the specific online learning process having variations or simplifications based on the sound quality characteristics.

According to another aspect of the present invention, a deep learning-based system for personalizing audio sound quality is provided, wherein comprises: an audio playback terminal, a cloud platform, and an online learning module, wherein, the audio playback terminal is configured to store user preference data;

the cloud platform is configured to form a baseline model, the baseline model is a neural network model trained by using audio data behavioral data, from multiple users or a single user;

the online learning module is configured to receive user preference data and learn the baseline model online to form a personalized audio sound quality model.

The system further comprises a monitoring and management platform used for scheduling, managing and monitoring the system.

BRIEF DESCRIPTION OF DRAWINGS

The above and other objects, features and advantages of the present invention will become more apparent with the detailed description of the present embodiments in conjunction with the accompanying drawings. The drawings are used to provide a further understanding of the embodiments and form part of the specification. The drawings are also used in conjunction with the embodiments to explain the invention and do not constitute a limitation of the invention. In the drawings, same reference number typically represents same component or step.

DETAILED DESCRIPTION OF PREFERRED EMBODIMENTS

In order to make the objects, technical solutions, and advantages of the present invention more apparent, illustrative embodiments according to the present invention will be described in detail below with reference to the accompanying drawings. Obviously, the embodiments are only partial examples of the present invention, and not all embodiments of the present invention. It should be understood that the present invention is not limited by the embodiments described herein. Based on the embodiments described herein, all other embodiments obtained by a person skilled in the art without the expenditure of inventive labor shall fall within the scope of protection of the present invention.

Figure 1:
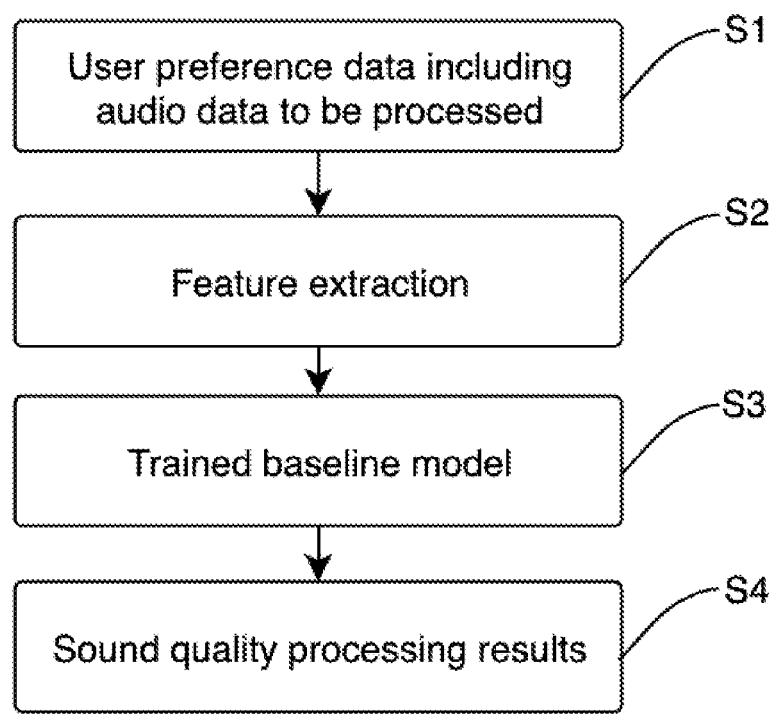
FIG. 1 is a schematic flowchart of a deep learning based method for processing sound quality characteristics according to embodiments of the present invention.

According to one aspect of the present invention, a deep learning based method for processing sound quality characteristic is provided. With reference to FIG. 1, a deep learning based method for processing sound quality characteristic is described according to an embodiment of the present invention. As shown in FIG. 1, a deep learning based method for processing sound quality characteristics comprises:

obtaining data characteristics of an audio data to be processed by extracting features (s2) from user preference data (s1) including the audio data to be processed;

based on the data characteristics, generating a sound quality processing result (s4) of the audio to be processed by using a trained baseline model (s3);

wherein the baseline model is a neural network model trained by using audio data behavioral data, and other relevant data from multiple users or a single user.

The user preference data comprises at least one of user behavior data, user audio list data, audio data in playback, ambient noise data, and device data, and other parameter data.

Different sound quality characteristics have different properties, and sound quality characteristics having the or similar properties could be processed by same or similar methods, the processing including, but not limited to, enhancements and/or recommendations and/or promotes of the sound quality characteristics.

As shown in Table 1 below, the sound quality characteristics are classified according to predetermined criteria, 7. the sound quality characteristic comprises characteristics relating to empirical fusion, artificial damage, sound quality feedback, empirical formula adjustment, signal domain calculation, noise, and/or other sound quality characteristics. The predetermined criteria include, but are not limited to, data acquisition difficulty, data quantification difficulty, or the difficulty of establishing mappings between subjective and data.

Data Acquisition Difficulty refers to the difficulty degree of obtaining user preference data related to audio quality characteristics. For example, the user's EQ (Equalizer) preference is a sound quality characteristic data that is difficult to obtain, because users rarely adjust the EQ manually, so it is difficult to obtain the user's EQ preference for a certain audio data. The manual encoding and compression of music is a sound quality characteristic data that is easy to obtain, such as transcoding flac lossless music into mp3 music shows that people prefer flac. The preference for music over mp3 is obvious, and the relevant data before and after transcoding, such as signal waveforms, can be used as preference data.

Data quantification difficulty refers to the difficulty degree of obtaining data features that directly map varying degrees and variations of the sound quality characteristics by extracting features from user preference data. For example, EQ is difficult to quantify, EQ is a series of artificially designed curves. The expression of EQ is the degree of strengthening or decay of each frequency point, which is a high-dimensional data and is difficult to reflect the intensity of EQ characteristics. Artificial coding compression is a sound quality characteristic that is easy to quantify. The intensity of Artificial coding compression could be expressed by parameters such as bit rate, sampling frequency size and the like. The sound quality of an audio format with low bit rates and low sampling frequencies is definitely different from the sound quality of the audio format with high sampling frequencies and high bit rates.

The difficulty of establishing mappings between subjective and data refers to difficulty degree of correlating user's subjective perception of the sound quality characteristics with the data characteristics directly. For example, bass strength is a sound quality characteristic that is difficult to correspond to subjective feelings, because not everyone likes music with strong bass, even if the bass strength of an audio can be calculated easily according to its frequency spectrum, it is still hard to determine whether this value will have a good or bad impact on a user's feelings. Manual encoding and compression is a sound quality characteristic that can be easily mapped to subjective feelings, because as long as the lossless audio is compressed, people's subjective feelings will be reduced. For a same code format, the lower the bit rate is, the worse the feeling would be.

In addition, the predetermined criteria could also include parameters that reflect the properties of the sound quality characteristics, such as the intensity of the sound quality characteristics, which is a parameter that characterizes how significant the sound quality characteristics are. For example, the characteristic of bass strength, the greater the proportion of energy in the low frequency band of the audio to the total energy of the spectrum, the greater the bass strength sound quality characteristic strength is. Methods of quantifying different sound quality characteristics may differ, and some may not be quantifiable. Generally speaking, sound quality characteristic has a quantifiable intensity would be data that could be quantified easily.

TABLE 1

| Type of Sound Quality Indicator | Examples | Data acquisition | Data Quantification | Mappings between subjective and data |
|---|---|---|---|---|
| Empirical fusion | EQ balance | Difficult Getting enough data is difficult because users seldom adjust EQ | Difficult EQ is hard to describe by an audio data. | Difficult Different users has different preference on EQ |
| Artificial damage | Sound quality loss due to coding | Easy Massive data could be obtained with an encoder and high quality audio | Easy Sound quality with varying degrees of damage could be obtained by changing coding parameters | Easy Subjective evaluation of audio with low bit-rate will certainly be lower than the audio before transcoding. |
| Sound quality feedback | Loudness | Medium User-adjusted loudness actions are accessible by deliberate collection | Easy Volume setting is one of loudness parameters | Easy Volume set by the user represent user's preference for volume in current environment. |
| Empirical formula adjustment | Transparency | Difficult Highly transparent music requires a special recording environment to record, and may not exist in user's audio list | Easy Music with different transparency could be obtained by processing current music through artificial models | Difficult Individuals have different preferences for transparent degree |
| Signal domain calculation | Bass intensity | Easy Bass intensity parameters can be obtained by analyzing audio frequency domain information | Easy Bass strength value is a direct reflection of the bass strength property | Difficult Individuals have different preferences for bass intensity. |
| Noise | Roar | Difficult User audio lists don't usually contain music with murmur. | Easy The richer the noise information is, the worse the sound quality would be | Easy The more informative the murmur is, the lower subjective would be |
| Others | | Uncertain May be difficult to obtain | Uncertain Possibly difficult to quantify | Uncertain May be difficult to map |

Below, with reference to FIG. 2A-FIG. 8, a deep learning based method for processing sound quality characteristics according to an embodiment of the present invention is described based on the different types of sound quality characteristics described above.

1. Characteristics Relating to Empirical Fusion.

Data of characteristics relating to empirical fusion (e.g., EQ equalization) are difficult to obtain, difficult to quantify, and difficult to establish a mapping between subjective perception and data. For specific attributes or classes of audio data, there are well-accepted methods in the field for adjusting sound quality characteristic parameters for example, general preference can be satisfied by adjusting a jazz style music using parameters of the sound quality characteristics of jazz style.

The audio data in the audio database has been tagged by users or other sources with categories including, but not limited to, "jazz", "classical", "lecture", "concert", etc., an audio data should correspond to multiple category labels. The category labels of the audio data are normalized to obtain a probability vector of the audio data corresponding to each category, and this vector is characterized by methods including and not limited to: matrix decomposition, factor decomposer, word vector quantization, and the like. Training to obtain a deep neural network relating to empirical fusion by using the data characteristics of the audio data as input layer data, and using the category tag features as output layer data. If the user prefers an audio data with no category label or an incomplete label, the audio waveform of this audio data will be mapped to a category label feature vector using the feature extraction method and the trained deep neural network relating to empirical fusion. Based on the category label feature vector, the fusion of existing audio quality characteristic parameters is designed and fed back to the user.

Figure 2A:
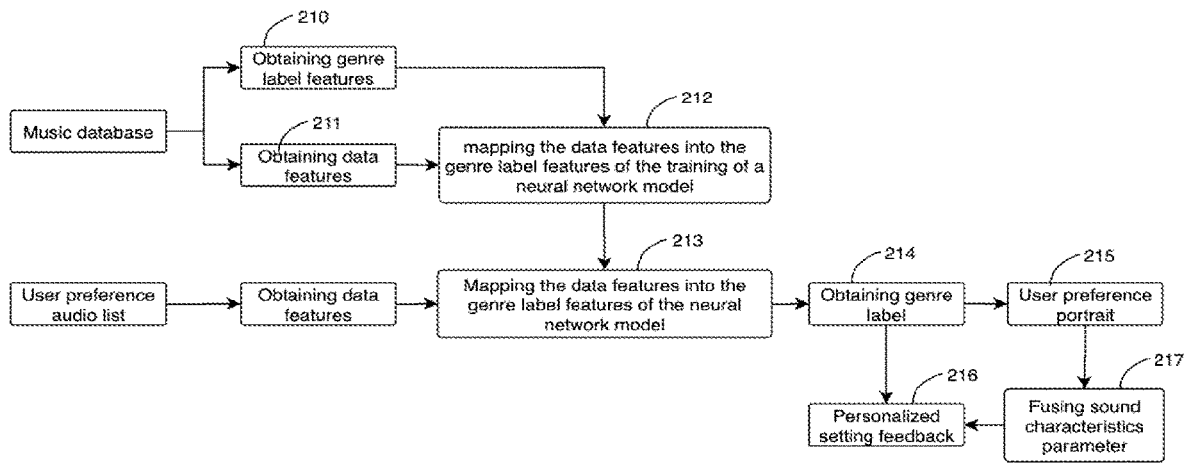
FIG. 2A is a schematic diagram of a deep learning method relating to empirical fusion according to embodiments of the present invention.
Figure 2B:
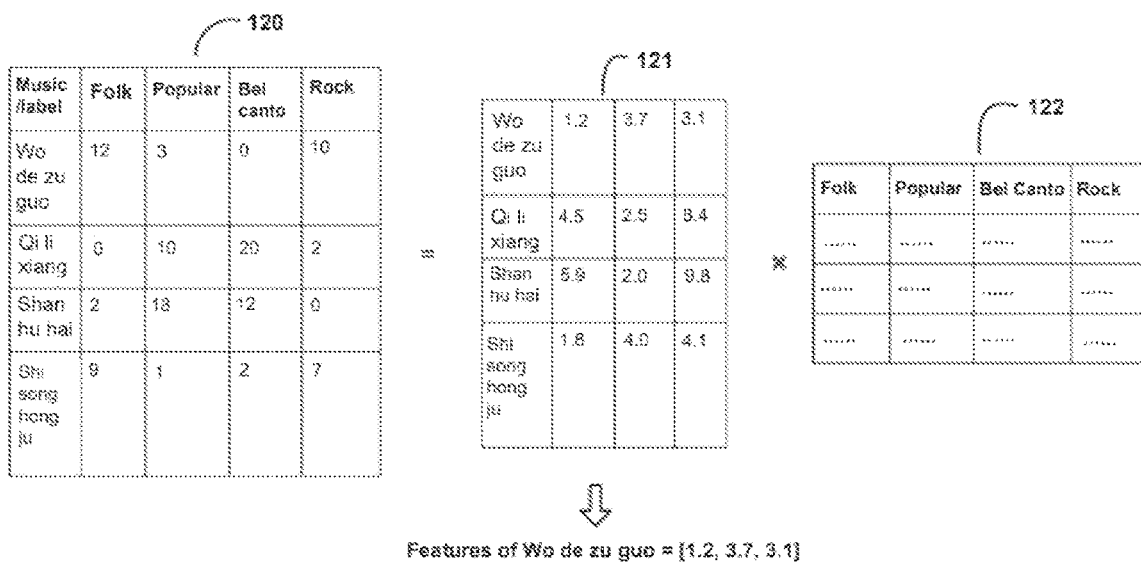
FIG. 2B is a schematic diagram of a process for extracting category label features according to embodiments of the present invention.

Referring to FIG. 2A, for the empirical fusion class sound quality characteristic, the sound quality characteristic processing method comprises:

A category tag feature (210) of the audio data and a data feature (211) of the audio data are extracted based on the audio database.

Wherein the method of extracting the category label features includes and is not limited to methods such as matrix decomposition, factor decomposer, word vector quantization, and the like. The data features of the audio data include and are not limited to features in audio waveforms that have distinct category distinctive portions. The method of extracting the data features includes and is not limited to Fast Fourier Transformation (FFT), Mel-Frequency Cepstral Coefficient (MFCC), and so on.

Figure 6:
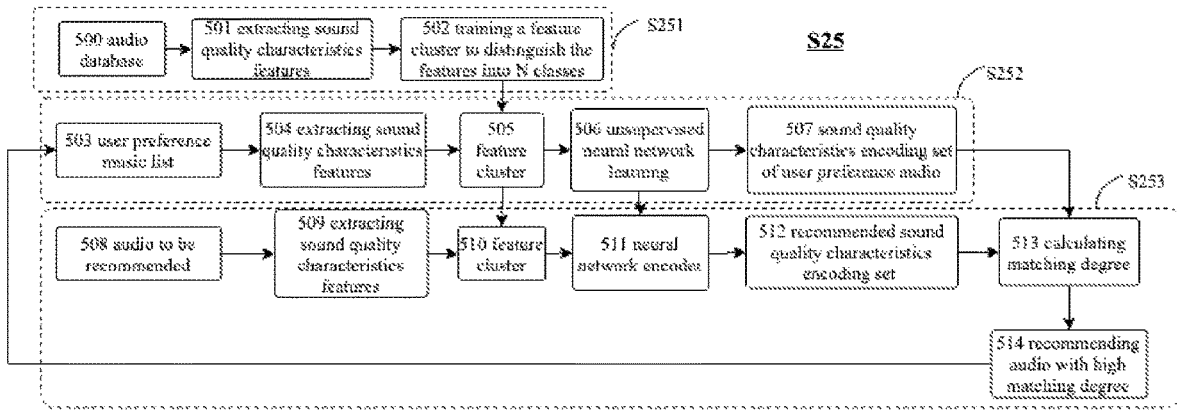
FIG. 6 is a schematic diagram of a deep learning method relating to signal domain calculation according to embodiments of the present invention.

In an embodiment, a matrix decomposition is used to illustrate the process of extracting the style label features of music data. Referring to FIG. 6, users label the style labels (e.g., style labels) of different music to form a labeling matrix 120. The data in the labeling matrix 120 represent the number of times the music has been labeled. For example, if 12 users label the music "Wo de zu guo" as "Folk Music", the the data in the line "Wo de zu guo" and row "Folk Music" of the labeling matrix 120 will be 12. Each row of the matrix 120 is labeled as a "style label" for a piece of music.

Each row of the original labeling matrix 120 is clearly a sparse vector. That is, it is normal for a music's style labels to have a few coordinates that are positive and others that are zero. It is very rare that all coordinates are positive. This means that most music should correspond to only a few styles, or even just one style. Therefore this labeling matrix 120 is very sparse. Style label feature extraction is needed so that the style features of each music are more dense and could better reflect the correlation of features between similar music.

The standard matrix 120 is decomposed, and the decomposition results are a style label feature matrix 121 and a weight matrix 122. Each row of the style label feature matrix 121 is a style label feature of a piece of music, which can be regarded as a compression of the sparse vector of style labels. Similar music has a high degree of similarity between the style label features, such as "Wo de zu guo" and "Shi song hong jun" feature cosine correlation is obviously higher than "Wo de zu guo" and "Qi li xiang". Each column of the weighting matrix 122 corresponds to a musical style, and the value of a column characterizes the weight of this musical style on each element of the style label feature matrix 121. The result of multiplying the style label feature matrix 121 and the weight matrix 122 is an approximate reduction of the original labeling matrix.

Training to obtain a baseline model (212) relating to empirical fusion by using the data characteristics of the audio data as input layer data, and using the category tag features as output layer data.

Extracting features of the audio data to be processed to obtain data features, inputting the data features to the baseline model relating to empirical fusion to obtain category tag features.

In an embodiment, a user preferred piece of music is obtained, features are extracted from the music waveform and are used as input of a computation using a neural network model, the output of the computation is a vector of style features, i.e., style label features, for the piece of music. For different segments of a music, the outputs may be different. Methods to obtain a final style feature include, but are not limited to: taking an average of the output of each segment, or taking other form of fusing (e.g., voting) result. Each piece of music outputs a final vector of style features.

Reverting the style label features of the user preference audio data to style labels (214) of the user preference audio data to form a user preference style portrait (215) based on the style labels of the audio data to be processed.

Figure 2C:
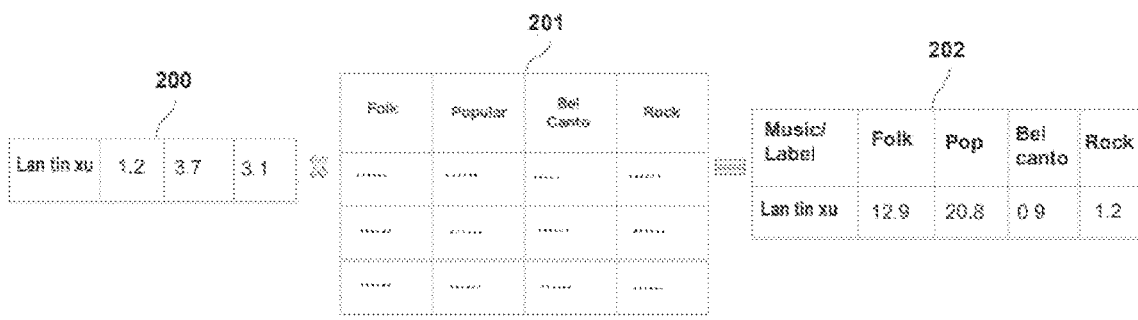
FIG. 2C is a schematic diagram of a process for reverting category labels according to embodiments of the present invention.

In an embodiment, a matrix decomposition is used as an example to illustrate the process of reverting the style tag features of the music data to style tags. Referring to FIG. 2C, the feature vector output from the deep neural network model is the style label feature 200 of the music data, multiplied by the weight matrix 201 (i.e., the weight matrix 122 in the style label feature extraction), will revert the possible style labels 202 of the music data. It should be noted here that if other style label feature extraction methods, such as factor decomposers, are taken earlier, the method of reverting the style labels should correspond to the feature extraction method.

Fusing to obtain personalized sound quality characteristic parameters (216) based on the user preference category portrait and sound quality characteristics parameters of the corresponding category.

Wherein, the user preference style portrait reflects a user's preference for each style of audio data. The user preference style portrait includes but not limited to a graph (e.g., a bar graph, a pie chart) reflecting a proportion or weight of each style of audio data. In an embodiment, the music label features that the user frequently clicks on have maximum values on the coordinates of the "Rock" style, and the drawing may show that "Rock" is the user's primary preference, then the rock style has a larger percentage of the drawing.

The personalized sound quality characteristics parameters are recommended to the user as the result of the sound quality processing (217).

2. Sound Quality Characteristics Relating to Artificial Damage.

The data associated with audio characteristics relating to artificial damage are easily accessible, such as lossy coded audio. audio data before and after encoding could be obtained easily, so that a mapping network between data before encoding and data after encoding could be set up directly.

Figure 3:
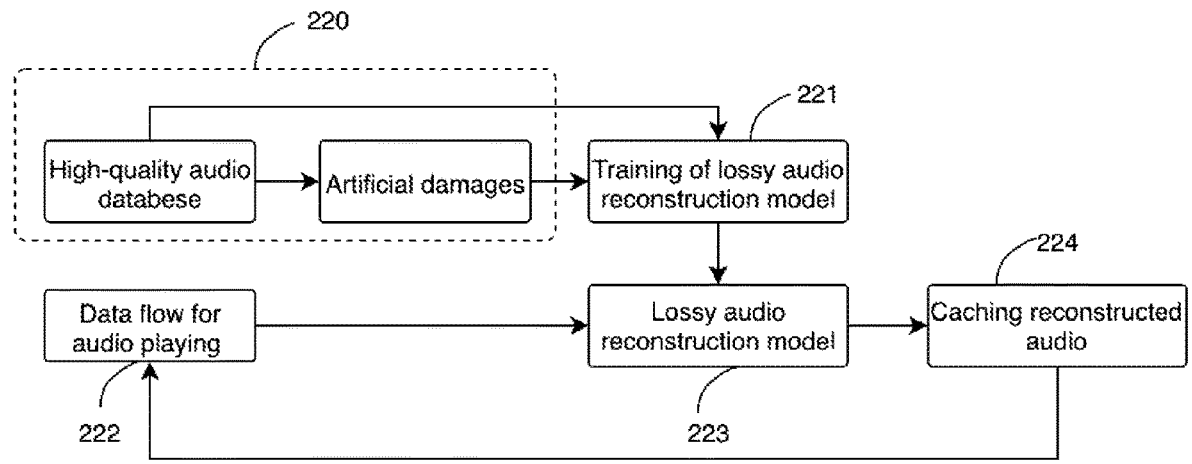
FIG. 3 is a schematic diagram of a deep learning method relating to artificial damage according to embodiments of the present invention.

Referring to FIG. 3, training the baseline model of sound quality characteristics relating to artificial damage comprises.

Artificially processing high-quality original audio data samples of audio databases to obtain low-quality lossy audio data samples. Extracting features of the high-quality original audio data samples and the lossy audio data samples respectively to obtain low-quality lossy audio data characteristics and high-quality original audio data characteristics (220).

The high-quality audio data samples include lossless audio data or high-quality audio data in other formats, which include and not limited to: Pulse Code Modulation (PCM) format, way format, Free Lossless Audio Code (FLAC) format, and lossless audio data or high bit rate audio data in other formats. The high bit rate audio data includes, but is not limited to, audio data obtained at a high bit rate or a higher sampling frequency, or other form of lossless audio data that has not been subjected to artificial damage. Feature extraction of this data is performed to obtain the output layer target of the reconstructed network. Typical scenarios of artificial damage to high quality audio data include and are not limited to: Adaptive Multi-Rate wideband (amr-wb) audio obtained at a sampling rate of 16 kHz and an encoding rate of 23.85 KBit Per Second (kbps), and Adaptive Multi-Rate narrowban (amr-nb) audio obtained at a transcoding to speech with a sampling rate of 8 kHz and an encoding rate of 12.2 kbps.

The processing includes and is not limited to artificial damage such as coding and decoding.

Methods of obtaining low quality audio data features and high quality audio data features include and are not limited to feature extraction after framing the lossy low quality audio data samples or the high quality audio data samples. The methods of feature extraction include and are not limited to Short Time Fourier Transform (STFT) and the like. Extracted features include and are not limited to frequency domain amplitude or phase information of the audio, time domain features or time domain waveform.

Training to obtain a baseline model relating to artificial damage (223) by using the low-quality lossy audio data characteristics as input layer data and using the high-quality original audio data characteristics as output layer data (221).

Extracting features of the audio data to be processed (222) to obtain data features, and inputting the data features into the baseline model relating to artificial damage to obtain reconstructed high quality audio data.

The audio data to be processed includes and is not limited to audio data stored or played that requires audio quality characteristics enhancement, and further includes and is not limited to: audio data that is being played or in a user list, or audio data stored at cloud end or user end. If the audio data to be processed is data stored offline, the data would be framed, if the data is played online, one or more frames of data will be cached.

A method of feature extraction of the audio data to be processed includes, but is not limited to, Short Time Fourier Transform (STFT), etc. Extracted features include and are not limited to frequency domain amplitude or phase information of the audio, time domain features or time domain waveform. The reconstructed high quality audio data includes, and is not limited to, the reconstructed time domain audio waveform.

Caching the reconstructed high-quality audio data for playback or storage by the user (224).

Here, it should be noted that the above audio data includes and is not limited to audio transmitted in the form of a data stream.

3. Sound Quality Characteristics Relating to Sound Quality Feedback:

For sound quality characteristics relating to sound quality feedback, obtaining data from one user comes at a cost, while obtaining data from many users are relatively easy. Therefore, a baseline model can be trained first with feedback data from a mass users, and a user-specific preference model can be obtained by learning the baseline model online based on the online feedback data of a specific user. In other words, a deep learning method is used to train the mass user preference data (including and not limited to the data parameters, environmental parameters, device parameters, etc. of the played audio data) of the mass user, map the mass user preference data to a neural network model to form a baseline model. After the audio quality adjustment results of the baseline model are fed back to the specific user, the baseline model is used for online learning, and the model is updated according to the feedback from the specific user to form a personalized audio quality adjustment model that reflects the specific user's own habits.

Figure 4:
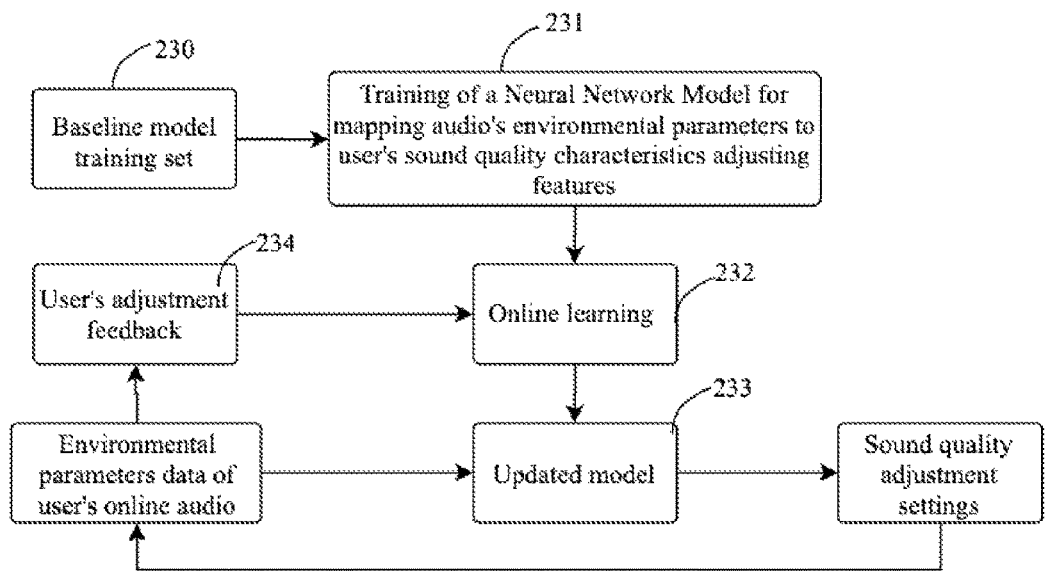
FIG. 4 is a schematic diagram of a deep learning method and an online learning method relating to sound quality feedback according to embodiments of the present invention.

Referring to FIG. 4, training the baseline model of sound quality characteristics relating to sound quality feedback comprises:

Extracting features based on environmental data of multiple user audio data and behavioural data corresponding to the environmental data respectively to obtain environmental data characteristics of the environmental data and sound quality setting characteristics of the behavioural data (230).

The mass-user audio data includes and is not limited to environmental data of the audio data, as well as corresponding behavioral data. The environment data includes various different parameter features depending on the audio quality characteristics, and the specific contents depend on the specific audio quality characteristics, for example, the audio quality characteristic of volume adjustment may be related to ambient noise, music style, and playback device, users will generally raise the volume in a high-noise background. Therefore, the environment data includes and is not limited to corresponding data or parameters of audio, ambient, audio device when the user makes an adjustment. The data or parameters include and not limited to ambient noise, music signal domain information, music style, ambient noise sets, such as airport, pedestrian street, and other site noise, device parameters, and the like. The corresponding behavioral data includes and is not limited to the corresponding audio feature settings and other data of the public user, such as data obtained by the user when listening to music in different noise environments and on different devices.

Training to obtain a baseline model relating to artificial damage by using the environmental data characteristics as input layer data and using the sound quality feedback as output layer data (231).

4. Sound Quality Characteristics Relating to Empirical Formula:

Sound quality characteristics relating to empirical formula is characterized in that, the audio could be artificially adjusted to obtain audio having enhanced sound quality characteristic based on the empirical formula. The intensity of the sound quality characteristics differs with different parameters. The adjustment parameter is called sound quality characteristic adjustment parameter. However, this kind of sound quality characteristic may not be preferred by all people, so it is also necessary to evaluate users' subjective feelings towards the different degrees of audio quality characteristic. The optimal parameters for adjustment are found by conducting subjective evaluation experiments on audio with different degrees of adjustment. Then a baseline model of the mapping of audio data characteristics to the optimal adjustment parameters is established by neural networks. In other words, the intensity of the audio features is subjectively evaluated to establish the mapping of the audio features adjustment parameters to subjective perception, and then the mapping network is trained to map the audio signal domain information to the audio features adjustment parameters. For specific users, feedback from specific users can also be used to learn the baseline model online.

Figure 5A:
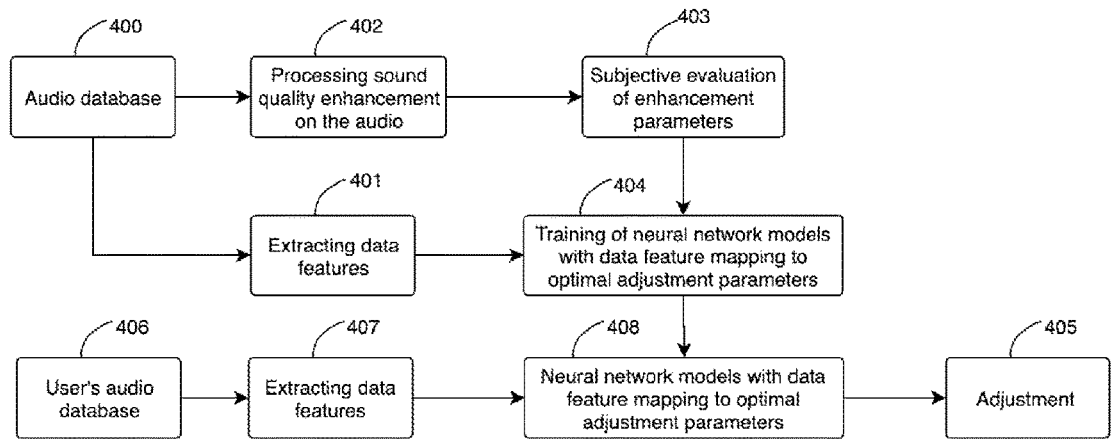
FIG. 5A is a schematic diagram of a deep learning method relating to empirical formula adjustment according to embodiments of the present invention.

Referring to FIG. 5A, training the baseline model of sound quality characteristics relating to empirical formula adjustment comprises.

Extracting features from audio data in the audio database (400) to obtain original data features (401).

The audio data includes and is not limited to raw music waveforms or signal domain data without sound quality characteristic enhancement processing; the method of feature extraction includes and is not limited to STFT.

Adjusting the sound quality of the audio data and extracting features from the audio data after adjustment to obtain adjustment characteristics (402), establishing a network model that maps the adjustment features to subjective evaluation through subjective evaluation experiments to obtain optimized sound quality adjustment parameters (403).

The sound quality characteristic adjustment includes and is not limited to adjusting the sound quality characteristics of the audio data according to a known empirical formula. The sound quality characteristic adjustment includes and is not limited to an enhancement or reduction of the sound quality characteristics. The subjective evaluation experiment is mapping the sound quality characteristic adjustment parameters to an average subjective perception of multiple users, including and not limited to a minimum perceptible difference experiment.

In one embodiment, the process of the subjective evaluation experiment is described in terms of a minimum perceptible difference subjective experiment. See FIG. 5B, an original music data is processed for sound quality characteristic enhancement, the processing function is f, and the processing parameter is P=p. If p can characterize the enhancement multiplier for a frequency point, and the enhancement can increase the strength of certain sound quality characteristics, then the music after the sound quality characteristic enhancement is m(1)=f(p). Processing the original music using the parameter $\Delta p$, then the processed music is m(2)=f(p)+$\Delta p$), and so on, the music processed with P(n)=p+$\Delta p$*(n−1) is recorded as m(n). The evaluator compares m(2) and m(1) until he finds a parameter P(n) that makes m(n+1) sound less subjective than m(n), at which point p+$\Delta p$*(n−1) is the best parameter for the sound quality characteristic enhancement process. When a same music is evaluated, different evaluators may have different results, and these evaluations can be averaged to obtain the best sound quality enhancement parameter for an audio for one sound quality characteristic.

Figure 5B:
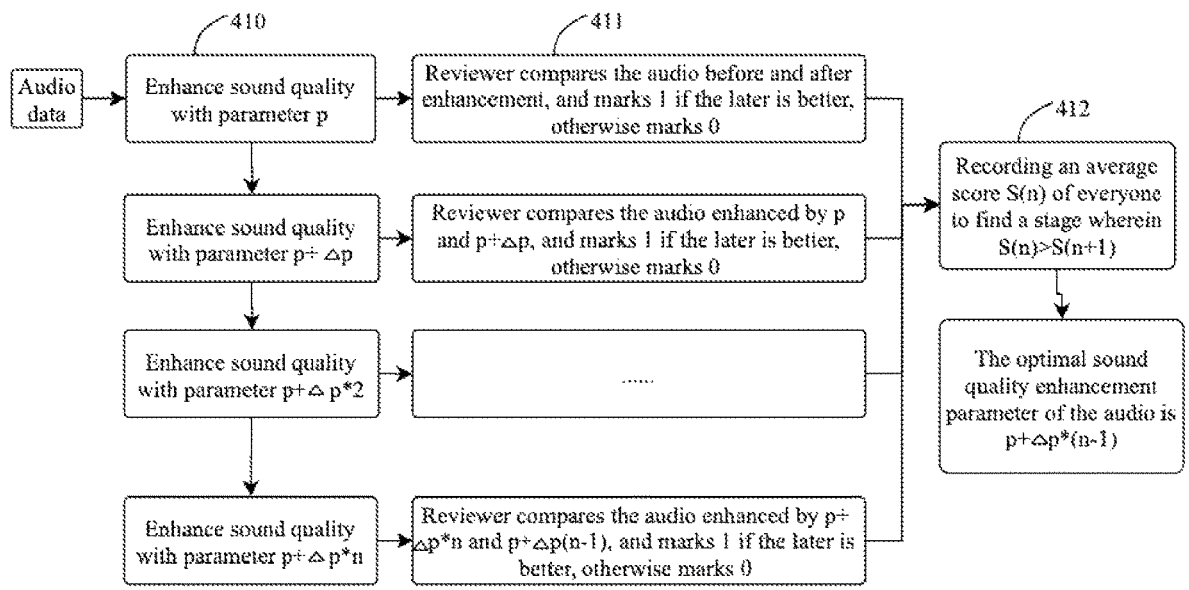
FIG. 5B is a schematic diagram of a subjective evaluation experimental procedure according to embodiments of the present invention.

Specifically, continuing with FIG. 5B, the audio is processed with the parameter p+$\Delta p$*(n−1) at nth stage (410). The rater's subjective evaluation of the audio produced by the nth and (n−1)th stages (411) is scored as 1 if the audio quality of the nth stage is better than that of the (n−1)th stage. 412 indicates an average score of all raters, if the average score of the nth stage greater than the average score of the (n+1) stage at n+1 stage, it indicates that the parameter p+$\Delta p$*n is an overprocessing parameter, while p+$\Delta p$*(n−1) is just the right parameter.

For example, p in the first stage can be a set of zero, and the audio processed by this set of parameters is of course the original audio. Then a comparison in the second stage would be between the original audio and the audio processed by $\Delta p$. If the reviewer believes that the original audio is the best, then it means that this audio is not suitable for being enhanced by this sound quality characteristics. For example, transparency may only be suitable for music with a natural style. Some types of music are unsuitable for sound quality characteristics enhancement. Once it is found that the user has a better subjective perception of the original audio compared to the processed audio, then this type of audio is not suitable for enhancement. Therefore the optimal enhancement parameter for this audio is a set of zero.

Training to obtain a baseline model relating to artificial damage by using the original data features as input layer data and using the optimized sound quality adjustment parameters as output layer data (404).

Extracting features from the audio data to be processed (406) to obtain data features (407), inputting the data features into the baseline model relating to artificial damage to obtain optimal sound quality characteristics of the audio data to be processed (408).

Wherein the audio data to be processed includes and is not limited to audio data in user's audio list or audio data being played.

The optimal parameters for adjusting the sound quality characteristics of the audio data to be processed are fed back to the user (405).

The feedback methods include, and is not limited to, feeding parameters back to the user terminal and processing by software in user terminal; feeding processed waveform back to online playback and processing based on a cloud platform.

5. Sound Quality Characteristics Relating to Signal Domain Calculation Comprises:

The data related to sound quality characteristics relating to signal domain calculation can be obtained from the audio signal domain information, therefore, it is easy to obtain and quantify the data. Not everyone prefers such sound quality characteristics, so it is necessary to evaluate users' perceptions to sound quality characteristics of different intensities. The degree of user preference for such sound quality characteristics is called user preference characteristic for such sound quality characteristics. It is easier to obtain audio data with such sound quality characteristics of different intensities and does not need to be generated manually Therefore, by dopting different algorithms with selectable models, and using unsupervised deep learning method to learn compressed feature on audio quality features extracted from the audio signal domain of user audio list, characteristics of user preferences for such sound quality could be learned, then other audio data similar to the user preferences characteristics available in the audio database is recommended to the user based on the learned characteristics.

Therefore, for sound quality characteristics relating to signal domain calculation, by using unsupervised deep learning method to learn compressed feature on audio quality features extracted from the audio signal domain of user audio list, characteristics of user preferences for such sound quality could be learned, then other audio data similar to the user preferences characteristics available in the audio database is recommended to the user based on the learned characteristics.

Referring to FIG. 6, training the baseline model of sound quality characteristics relating to signal domain calculation comprises:

Based on the audio data in the audio database (500), the sound quality characteristics features (501) is obtained by feature extraction after framing.

The audio data includes and is not limited to audio waveforms, and the style categories of the audio data should cover currently known style categories. The extraction of the sound quality characteristics includes and is not limited to calculations in accordance with known methods of calculating sound quality characteristics, and the sound quality characteristics include and are not limited to a characteristic vector of sound quality characteristics or an intensity of sound quality characteristics.

The characteristic vector of the sound quality characteristic could be a m-dimension vector. In an embodiment, take bass strength as an example, bass strength is a numerical value, which characterizes whether the bass part of the music is strong and powerful, and can generally be derived from the ratio of the energy of the low frequency band to the energy of the full frequency band. Assume that the low frequency band has m frequency points and the full frequency band has k frequency points, and the amplitude of each frequency point is S(i), i=1, 2 . . . k, then the amplitude of the full frequency band would be, and eigenvector of bass strength could be designed as V=[v1, v2 . . . vm], where Vi=S(i)/E, i.e., the value of the elements of V is the ratio of the amplitude of each frequency point to the amplitude of the full frequency point, and the sum of the elements of V can be regarded as the bass intensity. For other sound quality characteristics, eigenvectors can be selected according to actual calculation methods.

In other embodiments, the sound quality characteristic feature could be sound quality characteristic intensity, which includes and is not limited to numerical data. The sound quality characteristic eigenvector, then, is an intermediate result of calculating the sound quality characteristic strength.

However, in practice, the eigenvector is used more frequently rather than numerical data to calculate directly, as the eigenvector is more informative and more suitable for clustering machine learning algorithms.

Clustering (502) the sound quality characteristics features to obtain a clustering model, and clustering the sound quality characteristics features into N classes. The clustering method includes and is not limited to a Kmeans clustering algorithm.

Extracting features based on audio data (503) preferred by a user to obtain sound quality characteristics of the preferred audio data (504), inputting the obtained sound quality characteristics into the clustering model to generate a vector of sound quality characteristic distributions preferred by the user (505).

The method of collecting the audio data of the individual user's preferences includes and is not limited to selecting audio data that is frequently played by the user and/or audio data that is resident in the playlist and/or compliments.

The eigenvector of sound quality distribution represents the distribution of sound quality features of the audio data. For example, for an audio, there are c frames in total, and these frames are grouped into N classes after feature extraction. An eigenvector is used to represent the class distribution of the c frames, denoted by a vector U=[U1, U2, U3 . . . UN], wherein Ui is the number of frames belonging to ith class in the audio. For example, for U=[3, 4, 7, 9 . . . ], which means there are 3 frames whose sound quality features belong to class 1, 4 frames belonging to class 2, and 7 frames belonging to class 3. Obviously, the vector U is called the distribution vector of the sound quality characteristics.

An unsupervised neural network model (506) is trained as an encoder based on a distribution vector of the sound quality characteristics of the individual user preferences. The unsupervised neural network model is a baseline model of sound quality characteristics relating to signal domain calculation, and is used to encode and compress the input features. The unsupervised neural network includes and not limited to self-encoders, restricted Boltzmann machines, deep belief networks, and the like.

The distribution vector of the sound quality characteristics of an individual user's preferences is input into the encoder to obtain a coding set of the sound quality characteristics of the individual user's preferences (507).

In one embodiment, a hidden layer is intercepted in the network based on the encoder, using the distribution vector of the sound quality characteristics as an input of the network, and the output of the hidden layer could be set as an encoding of the input features. The hidden layer would be unique if a single hidden layer of self-encoders or a restricted Boltzmann machine is trained. If a multi-layered self-encoder or a deep belief network is trained, there will be a need to select one from multiple hidden layers. Each distribution vector of the sound quality characteristics corresponds to an encoding, and multiple encodings of user-preferred audio data characteristics make up a set of user-preferred audio characteristics encodings. These encoded characteristics can be viewed as an abstract representation model of the user's preference for that sound quality characteristics.

Based on at least one audio data (508) to be recommended, feature extraction is performed after framing to generate at least one audio data sound quality characteristic feature (509) to be recommended, and the clustering model is input for clustering to obtain a distribution feature vector (510) of the sound quality characteristics of the audio data to be recommended.

The method of selecting the audio data to be recommended includes and is not limited to: audio data randomly selected from an audio library and/or music data recommended by a recommendation algorithm of a music portal.

The distribution vector of the sound quality characteristics of the audio data to be recommended is input into the encoder (511), and the characteristic encoding of the sound quality characteristics of the audio data to be recommended is obtained (512).

Calculate the match degree between the sound quality characteristics encodings of the audio data to be recommended and the set of sound quality characteristics encodings preferred by individual users (513).

The match degree between two coded vectors can be calculated using a similarity algorithm, including and not limited to: cosine similarity, Euclidean distance, etc. An algorithm to calculate he match degree between a coded vector and a set of coded vectors includes and is not limited to: adding and averaging the similarities of each of the vector and a set of vectors, or taking the largest k similarities and averaging them, or averaging the values of a set of vectors to obtain the average vector, and calculating the similarity of the average vector to that vector.

Send the audio data with highest matching degree with predetermined number to the individual user (514).

In one embodiment, if the user does not like the recommended music (e.g., the user deletes or does not play the music), the music will be removed from the user's preferences, otherwise the recommended music will be included as part of the user's preferences and used to train a new encoder is repeatedly at an appropriate time.

6. Sound Quality Characteristics Relating to Noise.

Sound quality characteristics relating to noise is characterized by the fact that whenever it appears, it triggers discomfort in most human senses, and the higher the intensity of such sound quality characteristics is, the worse the subjective perception will be. It is possible to train a model for noise detection, calculate the noise probability of a frame or the noise category of a noise classification network by deep learning methods, train a noise reduction neural network with a specific category of noise, and after the noise category is obtained by the noise classification network, a specific model is selected for noise reduction.

Figure 7:
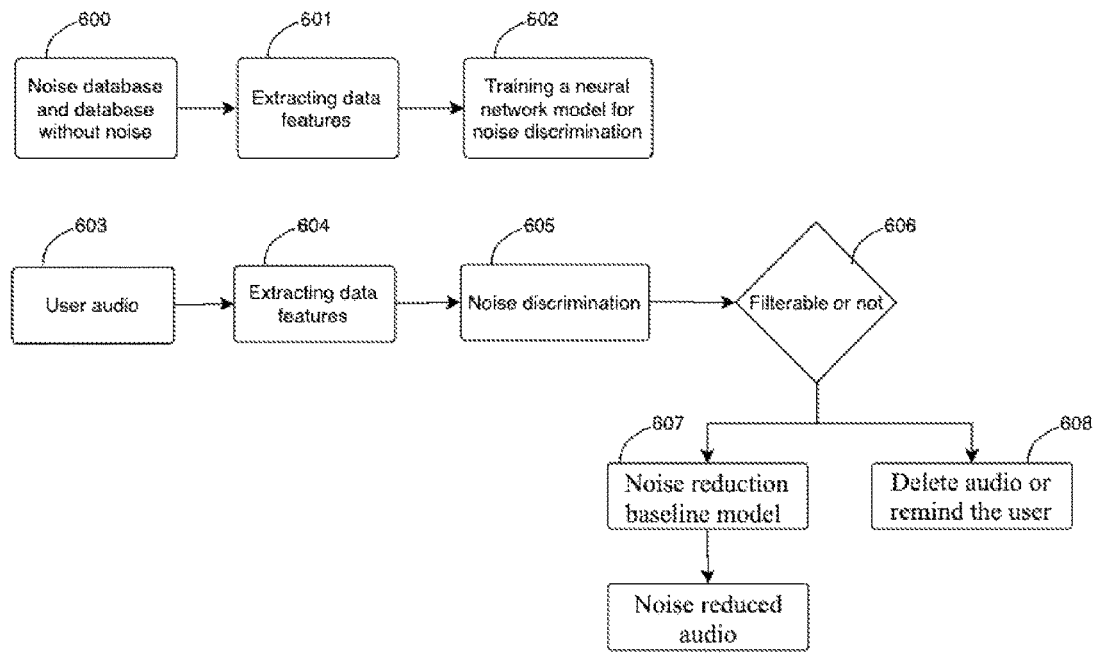
FIG. 7 is a schematic diagram of a deep learning method relating to noise according to embodiments of the present invention.

Referring to FIG. 7 of the appendix, for the noise-noise class sound quality characteristic, the sound quality characteristic treatment method comprises.

Extracting features based on the audio data (600) in the audio database containing the noise or normal sound category tag features to obtain data features and corresponding category tag features (601). The method of the feature extraction includes and is not limited to MFCC.

Training to obtain a classification baseline model relating to noise based on the data features and corresponding category tag features (602). The classification baseline model relating to noise is able to distinguish whether an audio frame is normal or containing a certain class of noise, i.e., a noise classifier. In addition, in practice, the available samples with noise may be much less than the available normal samples, and this problems can be solved by some training strategies, such as using an integrated learning approach to spread the normal audio samples among a plurality of classifiers.

A data feature (604) of the audio data to be processed (603) based on the audio data to be processed is obtained by framing and feature extraction, inputting the data feature into a classification baseline model of the sound quality characteristics relating to noise to obtain a discrimination result (605). The noise discrimination result includes and is not limited to noise or normal audio of the audio data frame. In one embodiment, the noise discrimination result also includes whether the audio data contains a large amount of noise, the large amount of noise comprises and not limited to a certain number of consecutive occurrences of the noise frame, i.e., the audio needs to be processed.

The audio data to be processed is processed based on the noise discrimination results (606) is processed. Wherein the processing includes, but is not limited to, de-noise frequency enhancement, prompting the user, or deleting the audio data.

Further, if the results of the noise discrimination show that the noise is filterable (including and not limited to babble ambient noise, whistling, current sound, etc.), a trained noise reduction baseline model is used to obtain a noise-reduced audio data (607); if the results of the noise discrimination shows that the noise is non-filterable, a notice is sent to the user to delete the audio data to be processed (608).

In one embodiment, according to the Ideal Binary Mask method and the feature mapping method, the method to train the noise reduction baseline model of sound quality characteristics relating to noise comprises.

Based on the time domain or frequency domain characteristics of the audio data in the audio database, divide it into time domain or frequency domain units, classify each time domain or frequency domain unit as a noise class or normal audio class, remove the noise class time domain or frequency domain units, and obtain pure audio data.

Training to obtain a noise reduction baseline model relating to noise by using the features of the audio data in time domain or frequency domain as input data and using the features of the pure audio data in time domain or frequency domain.

7. Other Sound Quality Characteristics.

Other sound quality characteristics are sound properties of unknown features, for example, sound quality properties without quantification method. Therefore, it is necessary to try to obtain data from audio waveform that can directly or indirectly reflect the relevant sound quality characteristics, or to process the audio waveform to obtain audio data with the relevant sound quality characteristics. The methods include, but are not limited to, unsupervised self-encoders, constrained Boltzmann machines, and other methods. Based on the nature of the data features, we establish a relationship between the features and subjective perceptions, including but not limited to: subjective evaluation experiments or unsupervised deep learning methods to learn the user's preferences for the features. Finally, the user's feedback on the data is used as a training set to learn the baseline model online. The model includes, but is not limited to, a network of mappings from the data or data features to subjective perceptions.

Figure 8:
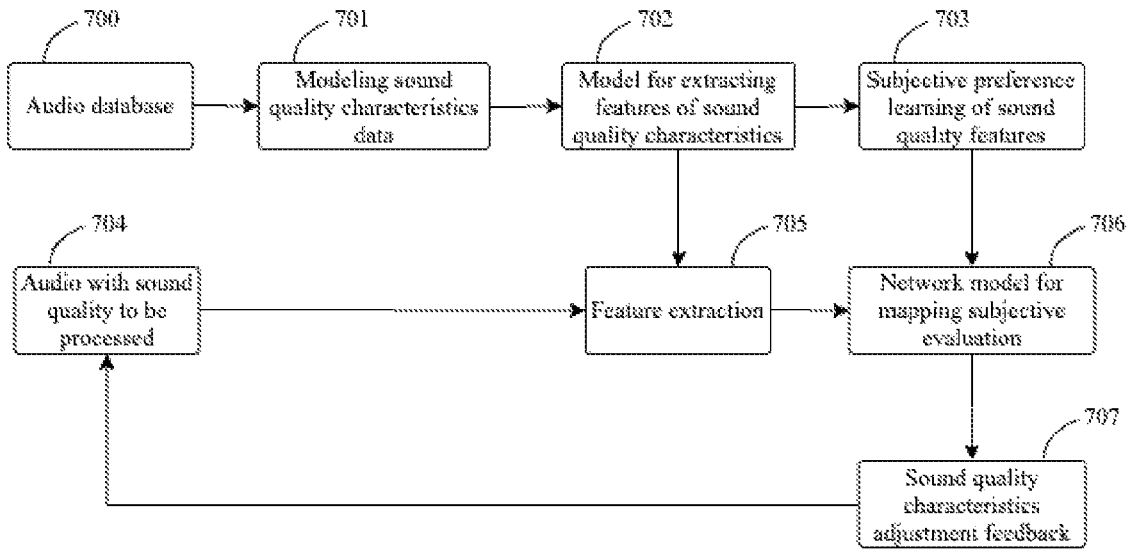
FIG. 8 is a schematic diagram of a deep learning method relating to other sound quality characteristics according to embodiments of the present invention.

Referring to FIG. 8, for other sound quality characteristics, the sound quality characteristic processing method further comprises.

Based on an audio database (700) to obtain audio data (701) that directly or indirectly reflects other classes of sound quality characteristics.

The audio data in the audio database described herein includes, but is not limited to, parametric information such as audio waveforms, title style labels, etc., and should be correlated with other audio quality characteristics of unknown properties. If it is difficult to determine whether it is correlated, then as many as different types of audio data need to be collected to cover various styles.

Obtaining audio data reflecting other sound quality characteristics includes, but is not limited to, obtaining audio data from audio data stored or received at the user's end, or processing the audio waveforms to obtain audio data with relevant sound quality characteristics. The basic method of obtaining audio data reflecting other types of sound quality characteristics includes and is not limited to empirical analysis, statistical characterization of data, subjective experiments, etc. For example, the sound quality characteristics may be related to midrange, or even belong to the category of midrange characteristics, then extracting the frequency spectrum of midrange of the audio data is an effective data extraction way. In addition, audio data reflecting other sound characteristics may be obtained by relatively sophisticated methods, including, but not limited to, collecting samples that clearly have other sound quality characteristics, machine learning methods trainable with small data including, but not limited to, Support Vector Machine (SVM), k-NearestNeighbor (KNN), and other methods. NearestNeighbor, proximity algorithm), etc. Inputting data features extracted based on the sample data and differentiating between the audio data and other audio data of the audio quality characteristics to determine whether the data features have classification ability for such class of audio quality characteristics, and if the classification ability is not obvious, other data models would be tried. The methods for determining whether the classification ability is apparent include and are not limited to statistical methods, such as Analysis of Variance (ANOVA).

Extracting features based on the audio data reflecting other sound quality characteristics to form a model to extract features from other sound quality characteristics (702), and then obtain features of other sound quality characteristics.

Because the audio data of other sound quality characteristics is only related to the sound quality characteristics, and cannot directly reflect the strength or characteristics of the sound quality characteristics, so it is necessary to extract features of the audio data of the other classes of sound quality characteristics to obtain the characteristics that can directly reflect the sound quality characteristics, or to form a model that can calculate the strength of the sound quality characteristics. Basic methods of feature extraction include, but are not limited to, feature design, and may require the design of relevant statistical parameters to characterize certain properties of the sound quality characteristics. Those of skill in the art should be aware that there may not be a single correct feature design herein, and that many different designs may have to be tried and adjusted based on the results of subjective experiments. More sophisticated methods of feature extraction include and are not limited to using unsupervised deep learning methods to obtain feature extraction models of the sound quality characteristics, including and not limited to self-encoders, constrained Boltzmann machines, etc. Encoding audio data models with distinct sound quality characteristics might obtain ambiguous results, which might be better than manually designed features. (Feature extracting method similar to the feature extraction method of sound quality characteristics relating to signal domain calculation is shown in FIG. 6).

Training to obtain a baseline model relating to other sound quality characteristics by using the features of other sound quality characteristics as input layer data, and using subjective perception evaluation obtained by mapping other sound quality characteristics to a network model of subjective evaluation as output layer data, or based on user preferred features of other sound quality characteristics (703). Training methods include and are not limited to: subjective evaluation experiments or unsupervised deep learning.

Other sound characteristics include but not limited to the following two cases. In one case, other sound characteristics can only be obtained by human adjusting, data features can only be obtained from audio databases covering various styles, and the obtained data features do not reflect user preferences, therefore it is necessary to design a subjective evaluation of the experiment (similar to sound quality characteristics relating to the empirical formula adjustment in FIG. 5B) to map the audio data of other sound quality characteristics to data characterizing the average subjective perception of users. In another case, the audio data preferred by the user is capable of exhibiting the strength of the sound quality characteristics, an unsupervised deep learning method is utilized to extract the user's preferred characteristics (similar to the feature self-learning method of the sound quality relating to signal domain calculation in FIG. 6). For example, matching degree between the audio data's sound quality characteristics and the user's preferred characteristics is a mapping of audio quality characteristics to subjective preferences, the higher the matching degree is, the more the user is likely to like the audio.

Based on the audio data to be processed (704), extracting features of other sound quality characteristic (705), and inputting the extracted features into the baseline model to obtain a subjective user perception evaluation and generate processing results of other sound quality characteristics (707). The processing results include, but are not limited to, performing audio quality characteristic enhancement according to the parameters output from the baseline model, or deciding whether or not to recommend the audio data to be recommended.

Although it is possible process the sound quality characteristics based on the baseline model of the sound quality characteristics, however, each person has different preferences for sound quality characteristics, in order to achieve personalized automatic adjustment, user preference data containing user feedback data on the parameters of the recommended sound quality characteristics could be collected and used to relearn the baseline model on the basis of the original baseline model parameters to obtain personalized sound quality characteristic processing models. In fact, the sound quality characteristic comprises characteristics relating to empirical fusion, artificial damage, sound quality feedback, empirical formula adjustment, signal domain calculation, noise, and/or other sound quality characteristics. Sound quality characteristic processing methods that can obtain user feedback on the sound quality parameter settings can be used to adjust the baseline model or personalized sound quality characteristic processing model with feedback during the user's use.

Figure 9:
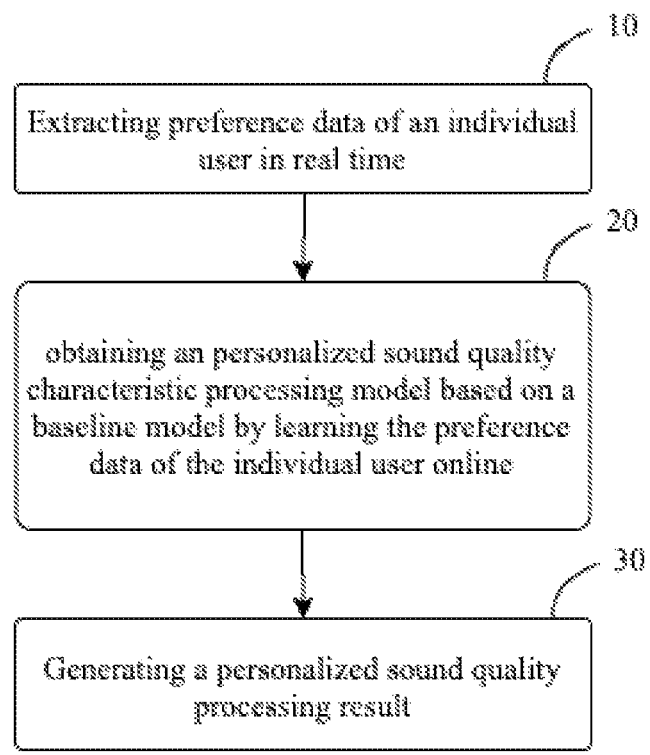
FIG. 9 is a schematic flowchart of a deep learning based method for processing personalized sound characteristics according to embodiments of the present invention.

According to another aspect of the present invention, a deep learning based personalized sound quality characteristic processing method is provided. With reference to FIG. 9, a deep learning based personalized sound quality characteristic processing method according to embodiments of the present invention is described. As shown in FIG. 9, the deep learning based sound quality characteristic processing method comprises.

Extracting preference data of an individual user in real time (10).

Training to obtain an personalized sound quality characteristic processing model based on a baseline model of sound quality characteristics by learning the preference data of the individual user online (20).

Generating a personalized sound quality processing result by using the personalized sound quality processing model (30).

The baseline model is a neural network model trained by using audio data behavioral data, and other relevant data from multiple users or a single user.

When user play audio data, user preference data that reflects user's preference for sound quality characteristics directly or indirectly is generated continuously, and the playback terminal records changes in such user preference data in real time.

Thus, the user preference data includes, and is not limited to, at least one of user behavior data, user audio list data, audio data during playback, ambient noise data, and other parameter data.

Wherein, user behavior data is behavioral data that can directly or indirectly reflect the user's preferences for sound quality characteristics, including and not limited to adjusting volume, deleting audio, playing audio, downloading audio, etc. User behavior data can reflect the user's setting preferences for sound quality characteristics.

User audio list data is parameter data of a user's preferred audio, including and not limited to parameter data of audio in audio playlists resident at the user's end, parameter data of audio that the user has praised a lot, and parameter data of audio that the user has collected. The parameter data is information data that comprehensively reflects audio data, including and not limited to audio waveform, style, title, author, album, etc. User audio list can reflect the user's preferences for different audio data.

The audio data being played is parameter data of audio data that is being played when the user provides feedback on the sound quality characteristic settings, the audio data being played including and not limited to audio waveform, style, title, author, album, and the like.

The ambient noise data is the ambient sound parameter data received by the microphone when the user provides feedback on the sound quality characteristic settings, and the ambient noise data includes and is not limited to the waveform, noise type, etc. The ambient noise data reflects the user's setting preferences for the sound quality characteristics in different environments.

The other parameter data is parameter data that reflects the user's preferences for the sound quality characteristics, and parameter data received or stored by the user.

Figure 10:
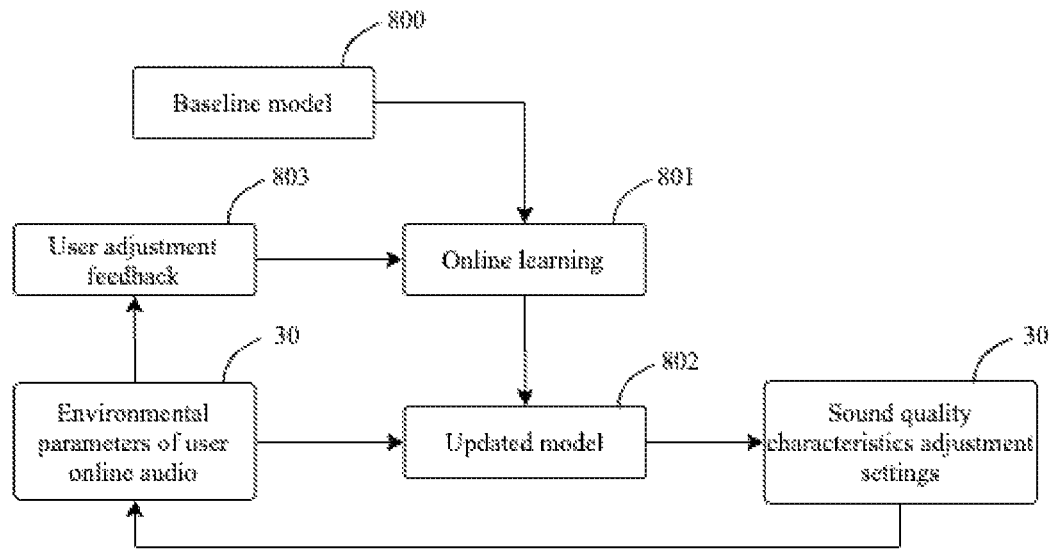
FIG. 10 is a schematic diagram of a training method for personalized sound quality characteristic processing models according to embodiments of the present invention.

Referring to FIG. 10, a method of training to obtain a personalized sound quality characteristic processing model according to embodiments of the present invention is described. As shown in FIG. 10, the method of training to obtain a personalized sound quality characteristic processing model comprises.

Updating the baseline model or an existing personalized sound characteristic processing model (802) based on a baseline model of the sound characteristic (800) and feedback data (803) from individual users on the processing results of the sound characteristic output from the baseline model for online learning (801).

The feedback data includes, but is not limited to: likes (e.g., playing, praise) or dislikes (e.g., removing from a list, removing from a device) of the audio recommended by the recommendation algorithm, changes to the audio quality characteristic settings (e.g., adjusting volume), other parameters when making the feedback (e.g., type of ambient noise, amplitude, style of the audio played, amplitude), and other user preference data.

The updated method includes, and is not limited to, a baseline model for user feedback learning when the number of the user feedbacks accumulates to a batch, or a personalized sound quality characteristic processing model that has been learned from the previous batch of feedbacks.

A set of sound quality characteristic setting parameters are solidified for the user when the personalized sound quality characteristic processing model is no longer updated. The criteria for no longer training includes and is not limited to: the user no longer or rarely acts on the new sound characteristic parameters with feedback, e.g., the user does not give feedback for more than a week or a month, the the current sound characteristic setting parameters could be exported and parameterized for the user. The user may choose to export and or store the sound characteristic setting parameters as a file.

Figure 11:
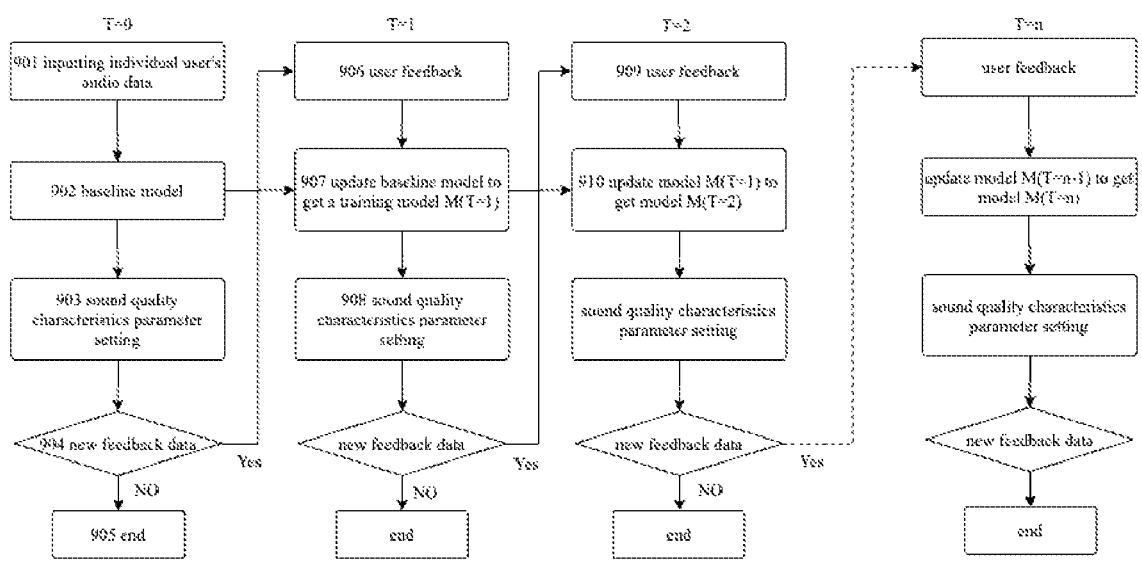
FIG. 11 is a schematic diagram of an online deep learning based method for processing personalized sound quality characteristics according to embodiments of the present invention.

In an embodiment, see FIG. 11, a method of online learning according to the embodiment is described. As shown in FIG. 11, the method of online learning comprises.

Inputting individual user's audio data (901) into the baseline model (902) to generate recommended processing results for the sound quality characteristics.

The audio data of the individual user includes and is not limited to environmental data of the individual user's current audio, audio list information, preference information, and other data. All the data is subset of the user's preference data.

Configure the processing results of the recommended sound quality characteristics described above to the individual user or upload to the cloud (903).

When a predetermined value is reached in the feedback data of the individual users, as a feedback batch T=1 (904), the feedback data of T=1 batch of individual users (906) is used as an input layer to train and to update the baseline model to obtain the personalized sound quality characteristic processing model M (T=1) (907).

Wherein, if the user is satisfied with the results of the recommended sound quality characteristic processing described above, the user will not adjust the sound quality characteristic settings for the time being, and no new feedback data is available to update the model, and the training ends (905). Otherwise, if the user still adjusts the sound quality characteristic settings in the future, it means that the current model is not user-personalized sound quality characteristic processing, and the online learning will continue based on the current model.

Based on the output of the described personalized sound quality characteristic processing model M (T=1), the results of the sound quality characteristic processing are fed back to the user (908), and then the process of user feedback is carried out, and if the user is not satisfied, new feedback data is provided, then the feedback data of the individual user of the cumulative T=2 batch (909) is accumulated.

Training with the feedback data of the individual users of the T=2 batch of individual users updates the personalized sound quality characteristic processing model M (T=1) to obtain the personalized sound quality characteristic processing model M (T=2) (910), and so on until the users no longer give feedback or no longer give feedback for a longer period of time.

Since user preferences are subjective and difficult to quantify, it is difficult to input user preferences at the feature input layer of the model. One way is to train a proprietary model for a user using only the user's audio quality adjusting behavior data. A deep neural network requires a lot of data to train, but in reality it is difficult to get many users' behavior data at once to train a deep neural network. It is possible to train a baseline model based on other users' data. Certain user's preferred behavior, such as regulating volume is learned online for this baseline model, where the baseline model has learned generic features of the sound quality characteristic from extensive user data.

As previously shown in FIG. 10, it describes a general method of online learning of sound quality characteristics: outputting sound quality characteristic processing results based on a baseline model of the sound quality characteristics, online learning through feedback data from individual users on the sound quality characteristic processing results, updating the baseline model to obtain a personalized sound quality characteristic processing model. The personalized sound quality characteristic processing model outputting personalized sound quality characteristics. The processing results, again, are continuously learned online through the feedback data of individual users on the processing results of the personalized sound characteristics, updating the existing personalized sound characteristics processing model to obtain a new personalized sound characteristics processing model, then the output sound quality processing results get closer and closer to the individual user preferences, until finally the user accepts it without further feedback.

In fact, sound quality characteristics that can obtain user feedback on the settings of sound quality characteristics relating to empirical fusion, artificial damage, sound quality feedback, empirical formula adjustment, signal domain calculation, noise, and/or other sound quality characteristics, all the characteristics can be used to adjust sound quality characteristic processing models (including and not limited to baseline models or existing personalized sound quality characteristic processing models). Thus, the baseline model training process and the sound quality recommendation settings may be significantly different for different sound quality characteristics because of their different characteristics, and thus the details may differ somewhat from the process described in the aforementioned general approach to online learning of sound quality characteristics, which is generally somewhat simplified.

The following is a description of the approach to online learning for each of the different types of sonic characteristics.

1. Sound Quality Characteristics Relating to Empirical Fusion.

Figure 12:
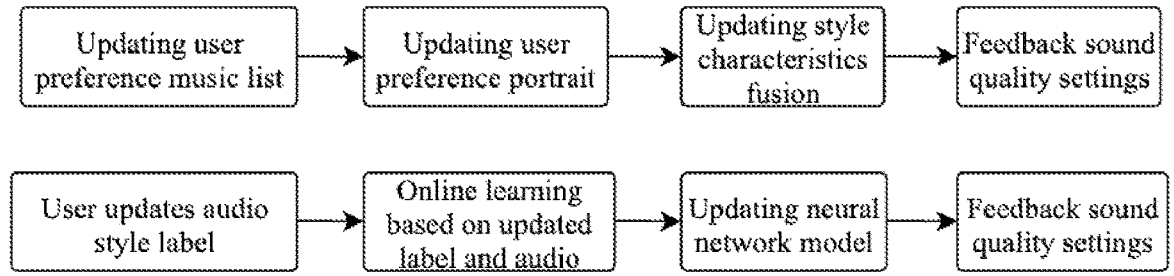
FIG. 12 is a schematic diagram of an online learning method of sound quality characteristics relating to empirical fusion according to embodiments of the present invention.

Referring to FIG. 12, online learning of empirically fused class sound characteristics includes and is not limited to the following two methods.

(1) When a user preferred list in the user preference data is updated, user preference category portraits are also updated, fusion results of sound quality characteristics parameters are updated, recommended results for the sound quality characteristic parameters will also be more oriented towards the current user's preferences, and the baseline model is not updated.

(2) When data characteristics of the sound quality characteristics changed after user feedback, the baseline model is retrained based on the data characteristics of the sound quality characteristics after user feedback to obtain a personalized sound quality characteristics processing model relating to empirical fusion.

2. Sound Quality Characteristics.

Since effective reconstruction of lossy audio data is bound to improve the subjective perception of any user with normal hearing, and users may not have a general preference for this type of sound quality, online learning is to recommend existing models to users based on their common audio formats, or to customize hybrid models.

In an embodiment, if a user regularly listens to 128 kbps MP3 music, and the system downloads the 128 kbps MP3 audio and upgrades the audio to a flac model for the user, but perhaps the audio format will change when playing, such as into wma, then the online learning method may be determining the user's existing audio format and prompting the user to download it, or to automatically download the corresponding reconstructed model. Training a hybrid model suitable for multiple audio format enhancements that is capable of supporting the reconstruction of two or more encoded forms of audio, the enhancement quality may not be as good as a model with a single format input, but there are advantages to saving space storage on playback devices.

3. Sound Quality Characteristics Relating to Sound Quality Feedback.

Referring to FIG. 4, the online learning method of sound quality characteristics relating to sound quality feedback include, but are not limited to:

Updates the baseline model, or the current personalized sound quality characteristic processing model, based on user feedback training with the output sound quality characteristic processing results (234), to form a personalized sound quality characteristics processing model relating to sound quality feedback (233).

Specifically, the baseline model, or the model obtained from the last online learning includes but is not limited to deployment on the user side or in the cloud. When the user plays the audio data, the baseline model, or the model trained after the last user feedback will output a sound quality characteristic adjustment value based on the current audio data environment parameter information, if the user is satisfied with this value, then the model is no longer trained, otherwise the user will readjust the sound quality characteristics. Record this adjustment value, and when it reaches a certain amount, enter it into the existing model for online learning of the existing model.

The existing model is continuously updated with data on the sound quality characteristic settings that the user continuously adjusts on the output of the existing model until the user is no longer or less likely to correct the settings of the model, at which point the personalized model is considered to be trained completely.

4. Sound Quality Characteristics Relating to Empirical Formula Adjustment.

Figure 13:
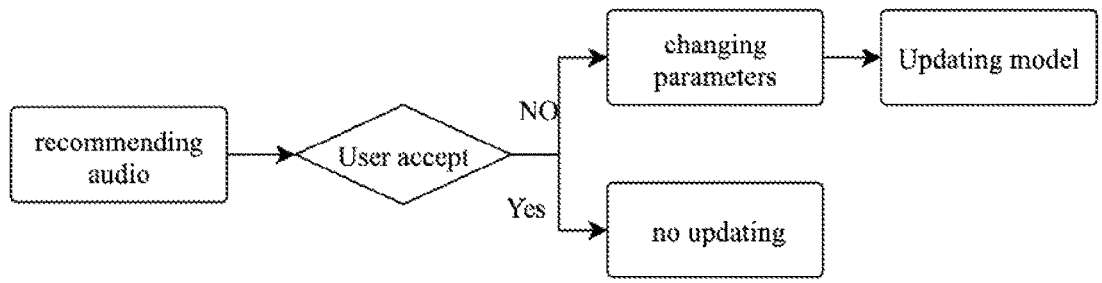
FIG. 13 is a schematic diagram of an online learning method of sound quality characteristics relating to empirical formula adjustment according to embodiments of the present invention.

Referring to FIG. 13, for sound quality characteristics relating to empirical formula adjustment, an audio data is processed with the processing parameters recommended by the baseline model, and the user may accept this processing (multiple play, adding playlists, downloading, etc.) or not (deleting, removing playlists, etc.). If the user accepts, the baseline model or current personalized sound quality characteristics processing model does not need to be updated. If the user does not accept, which means the parameters are a set of zero for the audio date is not suitable for processing or the parameters are changed for being processed by the baseline model. The processing parameters for the output are adjusted, then the baseline model or current personalized sound quality characteristics processing model are adjusted with the adjusted audio data and processing parameters.

5, Sound Quality Characteristics Relating to Signal Domain Calculation.

Figure 14:
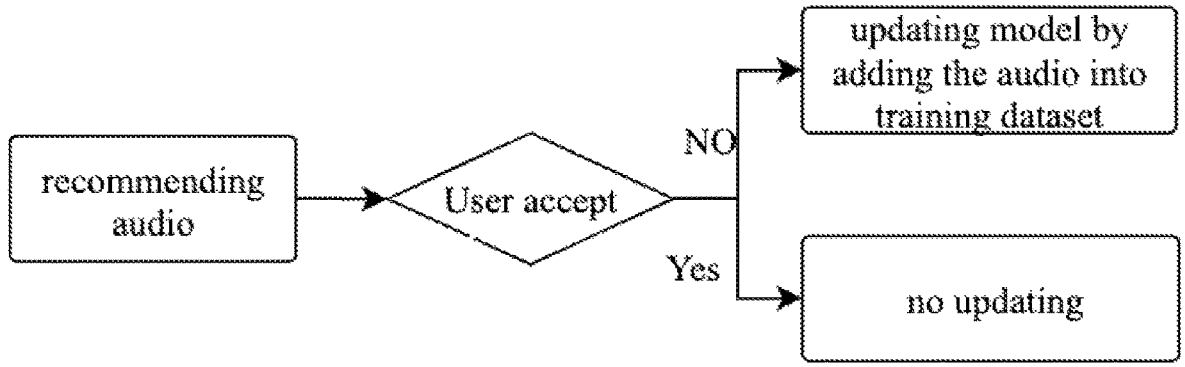
FIG. 14 is a schematic diagram of an online learning method of sound quality characteristics relating to signal domain calculation according to embodiments of the present invention.

Baseline models of sound quality characteristics relating to signal domain calculation are essentially trained using individual user preference data, so there is no obvious mass style baseline model, such as the model trained based on the original audio list of each user. Referring to FIGS. 6 and 14, the online learning method is to use an encoder (511) to calculate a matching degree (513) an encoding of the audio quality characteristic of an audio data to be recommended (512) and an encoding dataset of the audio quality characteristic preferred by the individual user (513), and sending audio data with highest matching degree with predetermined number to the individual user, and recommending one or more audio data to the user. The user may accept (multiple plays, adding to playlists, downloading, etc.) or not (deleting, removing playlists, etc.). If the user accepts the recommended audio data, the audio data is considered to be the audio data preferred by the user and to be added to the individual user preferences (503). Using the updated audio data of the individual user preferences (503) to update the encoder (511).

6. Sound Quality Characteristics Relating to Noise

Sound quality characteristics relating to noise cause a reduction in perception to the average user whenever they occur, and thus are not a user-preferred audio feature, but generally a user-hated audio feature. Therefore, there is a need to replenish the noisy noise samples and update the baseline model for all users via a cloud-based engine. Methods for online learning include and are not limited to: if a user hates or frequently encounters a certain class of noise, customizing a dedicated classifier or denoiser for that class of noise for the user through user feedback information. Including and not limited to the scenario: customizing a noise reduction model for airport noise for a user working in an airport.

7. Other Sound Quality Characteristics.

Other sound quality characteristics apply to the general method of online learning described in FIGS. 10 and 11 above for describing the sound quality characteristics according to the embodiments of the present invention, and specific embodiments may vary in detail or be simplified depending on the characteristics of the sound quality characteristics.

According to another aspect of the present invention, a deep learning based system for personalizing audio sound quality is provided.

Figure 15:
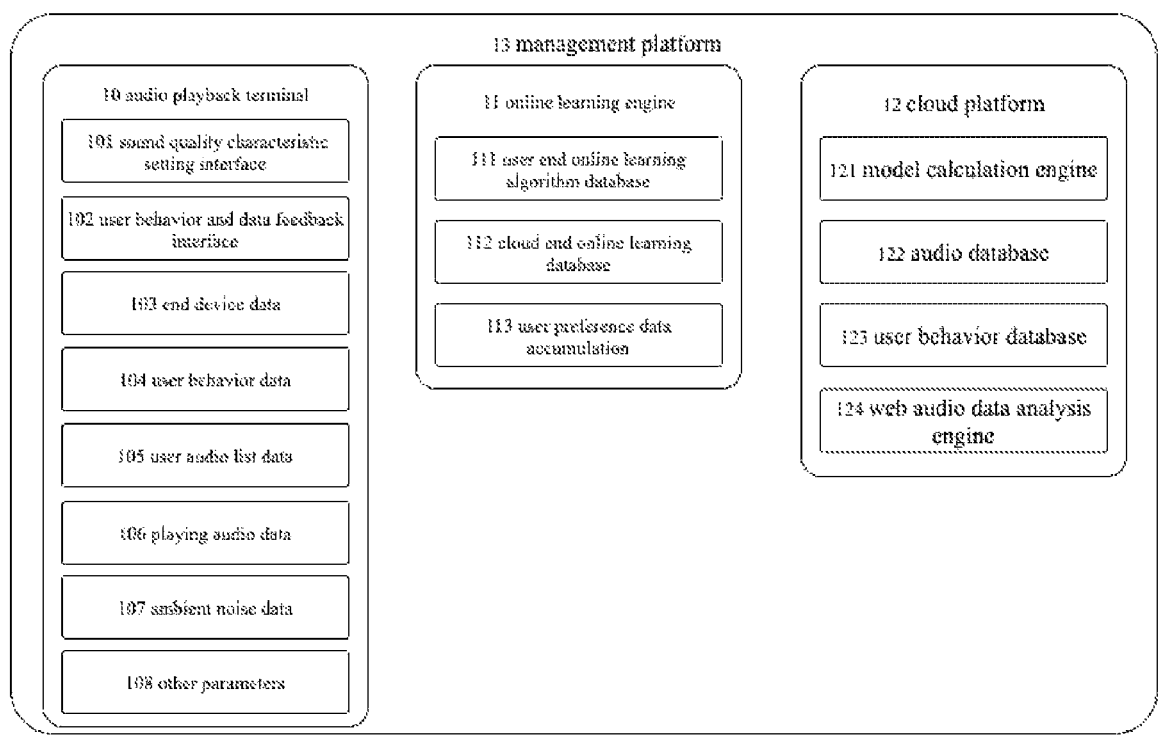
FIG. 15 is a schematic diagram of a deep learning-based system for processing sound quality characteristics or individual processing sound quality characteristic according to embodiments of the present invention.

Referring to FIG. 15, a deep learning based system for personalizing audio sound quality is described according to the embodiments of the present invention. As shown in FIG. 15, the system comprises: an audio playback terminal 10, an online learning engine 11, a cloud platform 12, and a monitoring and management platform 13.

The audio playback terminal 10, including but not limited to: a server, a PC, a tablet, a speaker, a cell phone, a headset and other devices, the audio playback terminal 10 is capable of playing audio and storing data, and is capable of communicating with the server-side devices. The audio playback terminal 10 stores audio quality related data, including but not limited to: user behavior data, terminal device data, user audio list data, ambient noise data, etc. The above data reflect or influence the user's preference for audio quality directly or indirectly, and collectively referred to as user preference data.

The audio playback terminal 10 comprises a sound quality characteristic setting interface 101, a user behavior and data feedback interface 102, an end device data module 103, a user behavior data module 104, a user audio list data module 105, a playing audio data module 106, an ambient noise data module 107, and other parameter module 108.

The sound quality characteristic setting interface 101 is used to receive sound quality enhancement adjustment settings recommended by the system, and configure the settings with the client-end or the cloud where the user logs in, and be able to manage the sound quality enhancement adjustment configuration module.

The user behavior and data feedback interface 102 is used for feeding user behavior, and associated data received and stored by the user side, back to the the online learning engine 11.

The end device data module 103 is used for storing or acquiring audio-related, user-end device parameters required for model training.

The user behavior data module 104 is used for storing user behavior data about sound quality characteristics settings, especially behavioral data directly or indirectly reflect user sound quality preferences, such as adjusting volume, deleting audio, playing audio, downloading audio, and the like.

The user audio list data module 105 is used for storing a list of audio preferred by the user, includes and not limited to audio playlists, audio praised by the user, and parametric data of audio data collected by the user. The parametric data including and not limited to audio waveforms, styles, titles, authors, albums, and the like.

The playing audio data module 106 is used for storing parameters of the audio being played while the user is giving feedback on the audio quality settings. The parameters include and not limited to audio waveform, style, title, author, album, and the like.

The ambient noise data module 107 is used for storing ambient sound parameters received by the microphone when the user provides feedback on the sound quality settings. The parameters include and not limited to noise waveforms, noise types, etc., The other parameter module 108 is used for storing other parameters related to sound quality that the user can receive or store.

The online learning engine 11 is capable of receiving data passed from the user side, analyzing the data, training the baseline model online, and receiving user preference data input into the online learning of the model feedback audio recommendation results.

The online learning engine 11 includes a user end online learning algorithm database module 111, a cloud end online learning database module 112, and a user preference data accumulation module 113.

The user end online learning algorithm database module 111 is deployable at the user end, includes lighter-weight sound quality enhancement algorithms for updating the baseline model to form a personalized model by analyzing data received from user behavior and parameter feedback interface delivery. During or after the processing, the module 111 will receive user preference data and send the received data into the online learning model to output recommended sound quality results.

The cloud end online learning algorithm database module 112 is a sound quality enhancement algorithm that can be deployed in the cloud and is used to be able to update the baseline model to form a personalized model by analyzing the user preference data received from the user behavior and parameter feedback interfaces delivered to the model. During or after the processing, the module 112 will receive user preference data and send the received data into the online learning model to output recommended sound quality results.

The user preference data accumulation module 113 is a module for storing, filtering, rejecting, and uploading the user preference data received from the user behavior and parameter feedback interface delivered by the user behavior database in the cloud.

The user preference data is described in the following Table 2.

TABLE 2

| Data subset | Description | Examples of content |
| --- | --- | --- |
| Environmental dataset | Data of environment in which the audio is playing, could be captured by sound and image sensors, or selected manually by the user. | Ambient noise waveform, type of ambient noise, room type, room shape, etc. |
| Audio playback dataset | Data of audio being played, in the playlist, on the playback, or being collected | Audio waveform, audio title, audio type, etc. |
| User behaviorial dataset | Interaction behavioral data between user and audio | praising, downloading, favoriting, deleting, commenting, adding to lists, etc. |
| Software and equipment parameters | Parameters of the user's audio playback device and software | EQ settings, volume settings, filter parameters, frequency response curves, etc. |
| Other parameters | | |

The cloud platform 12 contains an audio database and a user preference database, and could explore audio-related data online. The cloud platform can use this data to train a baseline model, receive user preference data, input the received data into the baseline model to feedback audio quality processing results.

The cloud platform 12 includes a model calculation engine 121, an audio database module 122, a user behavior database module 123, and a web audio data analysis engine module 124.

The model calculation engine 121 is used to analyze various types of data in the cloud, trains modules of the baseline model, and receives user preference data, inputs the received data into the baseline model to output audio recommendation results after training is completed.

The audio database module 122 is used for storing audio data covering a wide range of genres and styles.

The user behavior database module 123 is used to collect user's preference data through various channels, including and not limited to the data uploaded through the user preference data accumulation module.

The web audio data analysis engine module 124 is capable of performing data exploring and analysis of audio information online, by means including and not limited to: obtaining style markups of music on music portals, obtaining a list of recommendations for similar music for a particular audio, and so on. The results of the exploring and analysis are provided to the model computation engine for model computation.

The management platform 13 is responsible for scheduling, managing and monitoring the entire system.

Compared with the prior art, the deep learning based method and system for processing sound quality characteristics provided by the embodiments of the present invention have the following beneficial effects.

First, basic sound quality enhancement could be achieved by training a baseline model, and individually processing sound quality characteristics could be achieved by learning the baseline model online based on the feedback information of the users.

Second, a more reasonable multi-category generic sound quality characteristics fusion could be obtained by category feature extraction and user preference statistics.

Third, all models are mapped from the time domain or frequency domain characteristics of the audio to subjective perceptions or audio quality parameter settings without referring to manual evaluation, audio title and other data, thereby the audio quality adjustment and enhancement "based on their own audio content" could be achieved without artificial information. Therefore, audio quality enhancement can theoretically be detached from the Internet, once the final personalized model training is completed, an offline devices having the model can also be adjusted independently.

Fourth, a lossy audio information reduction technique based on deep learning is provided.

Fifth, unsupervised deep learning methods could be used to learn user preferences for some of the quantifiable sound quality characteristics.

Sixth, enhancing and adjusting methods are provided for sound quality characteristics that cannot be quantified and classified at present.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

One skilled in the art may realize that the various units and algorithmic steps described in the embodiments disclosed herein could be implemented by hardware or a combination of software and hardware. Whether these functions are performed in hardware or software depends on the particular application and design constraints of the technical solution. The skilled person may use different methods to implement the described functions for each particular application, but such implementation should not be considered beyond the scope of the present invention.

In the several embodiments provided in this application, it should be understood that the disclosed devices and methods may be implemented in other ways. For example, the device embodiments described above are merely illustrative. For example, the division of the units described is only a logical functional division, and the actual implementation may have a different division. For example, a plurality of units or components may be combined or may be integrated into another device, and some features may be ignored or not performed.

A lot of details are illustrated in the specification provided herein. However, it should be understood that the embodiments of the present invention can be practiced without such specific details. In some examples, the known methods, structures, and techniques are not shown in detail so as not to obscure the understanding of the present specification.

Similarly, it should be understood that in order to streamline the invention and aid in the understanding of one or more of the various inventive aspects, in the description of exemplary embodiments of the invention, the various features of the invention are sometimes grouped together into individual examples, figures, or descriptions thereof. However, the method of the invention should not be construed as reflecting an intent that the claimed protection of the invention requires more features than those expressly recited in each claim. More precisely, as reflected in the corresponding claims, the inventive point is that the corresponding technical problem can be solved with less than all of the features of a single disclosed embodiment. Claims that follow a specific embodiment are thus explicitly incorporated into that embodiment, with each claim itself serving as a separate embodiment of the invention.

Those skilled in the art will understand that all features disclosed in this specification (including the claims, summary and drawings) and all processes or units of any method or equipment so disclosed may be combined in any combination, except where the features are mutually exclusive. Unless otherwise expressly stated, each feature disclosed in this specification (including the claims, abstracts and drawings) may be replaced by an alternative feature that provides the same, equivalent or similar purpose.

Furthermore, those skilled in the art will appreciate that while some of the embodiments described herein include features included in other embodiments, the combination of features of different embodiments means that they are within the scope of the present invention and form different embodiments. For example, in the claims, any one of the embodiments claimed to be protected could be used in any combination.

The embodiments of the present invention can be implemented in hardware, or in software modules running on one or more processors, or in a combination thereof. Those skilled in the art should understand that a microprocessor or digital signal processor (DSP) could be used in practice to implement some or all of the functionality of some of the modules in an article analysis device according to the embodiments of the present invention. The invention can also be implemented as a program (e.g., a computer program and a computer program product) for a device that performs some or all of the methods described herein. Such a program implementing the invention may be stored on a computer readable medium, or may have the form of one or more signals. Such signals may be available for download from an Internet site, or may be provided on a carrier signal, or in any other form.

It should be noted that the above embodiments illustrate rather than limit the invention and that those skilled in the art may devise alternative embodiments without departing from the scope of the appended claims. In the claims, no reference symbol located between parentheses should be constructed as a limitation of the claims. The word "comprising" does not exclude the existence of components or steps not listed in the claims. The word "one" or "a" preceding an element does not preclude the existence of a plurality of such elements. The present invention may be realized with the aid of hardware comprising a number of different elements and with the aid of a suitably programmed computer. Among the unitary claims enumerating a number of devices, several of these devices may be embodied in a single hardware item. The use of the words first, second, and third, etc., does not indicate any order. The words may be interpreted as names.

The foregoing is merely an illustration of or a description of embodiments of the present invention. The scope of protection of the present invention is not limited thereto. Any person skilled in the art may readily conceive of variations or substitutions within the technical scope disclosed by the present invention, which shall be covered by the scope of the present invention. The scope of the present invention shall be the scope of the claims.

What is claimed is:

1. A method comprising:
extracting features from audio data associated with a user;
determining, based on the extracted features, data characteristics of the audio data;
determining that the data characteristics are associated with artificial damage;
based on a determination that the data characteristics are associated with the artificial damage, training a baseline model by:
artificially processing original audio data samples of audio databases to obtain lossy audio data samples;
extracting features of the original audio data samples and the lossy audio data samples respectively to obtain lossy audio data characteristics and original audio data characteristics;
using the lossy audio data characteristics as input layer data and using the original audio data characteristics as output layer data; and
based on the data characteristics and the baseline model, generating a sound quality processing result of the audio data associated with the user,
wherein the baseline model comprises a neural network model.

2. The method of claim 1, wherein the audio data associated with the user comprises data indicating a user's preferences for sound quality characteristics.

3. The method of claim 1, wherein the audio data associated with the user comprises at least one of user behavior data, user audio list data, audio data in playback, ambient noise data, or user device data.

4. The method of claim 1, wherein the data characteristics comprise one or more of time domain or frequency domain characteristics.

5. The method of claim 1, further comprising:
determining the neural network model by performing an unsupervised deep learning method on the audio data associated with the user.

6. The method of claim 1, further comprising:
based on a determination that the data characteristics are associated with empirical fusion, training the baseline model by:
extracting category tag features and data characteristics from audio data associated with a plurality of users; and
training the baseline model by using the data characteristics of the audio data associated with the plurality of users as input layer data and using the category tag features as output layer data.

7. The method of claim 1, further comprising:
based on a determination that the data characteristics are associated with sound quality feedback, training the baseline model by:
extracting features from environmental data of audio data associated with a plurality of users and behavioral data corresponding to the environmental data respectively to obtain environmental data characteristics of the environmental data and sound quality setting characteristics of the behavioral data; and
using the environmental data characteristics as input layer data and using the sound quality feedback as output layer data.

8. The method of claim 1, further comprising:
based on a determination that the data characteristics are associated with empirical formula adjustment, training the baseline model by:
extracting features from audio data associated with a plurality of users to obtain original data features;
adjusting sound quality of the audio data associated with the plurality of users and extracting features from the adjusted sound quality of the audio data to obtain adjustment characteristics;
establishing a network model that maps the features from the adjusted sound quality of the audio data to subjective evaluation through subjective evaluation experiments to obtain optimized sound quality adjustment parameters; and
using the original data features as input layer data and using the optimized sound quality adjustment parameters as output layer data.

9. The method of claim 1, further comprising:
based on a determination that the data characteristics are associated with signal domain calculation, training the baseline model by:
extracting sound quality characteristics from audio data associated with a plurality of users;
clustering the sound quality characteristics to obtain a clustering model;
extracting sound quality characteristics from user preferred audio data;
inputting the extracted sound quality characteristics from the user preferred audio data into the clustering model to generate a vector of sound quality characteristic distributions; and
training the baseline model based on the vector of sound quality characteristic distributions.

10. The method of claim 1, further comprising:
based on a determination that the data characteristics are associated with noise, training the baseline model by:
extracting data features and corresponding category tag features from audio data associated with a plurality of users, wherein the audio data associated with the plurality of users comprises noise or normal sound category tag features; and
training the baseline model based on the data features and the corresponding category tag features.

11. The method of claim 10, further comprising:
determining a noise identification result based on the baseline model;
based on a determination that the noise identification result indicates that noise is filterable, determining to use a trained noise reduction baseline model to obtain noise-reduced audio data; and
based on a determination that the noise identification result indicates that the noise is non-filterable, sending a notice to a user, wherein the notice indicates deleting the audio data associated with the plurality of users.

12. The method of claim 1, further comprising:
based on a determination that the data characteristics are associated with other data characteristics, training the baseline model by:
obtaining audio data, associated with a plurality of users, from an audio database, wherein the audio data is associated with the other data characteristics;
extracting features of the other sound quality characteristics from the audio data associated with the plurality of users; and
using the features of the other sound quality characteristics as input layer data, and using (a) user preferred features of the other sound quality characteristics or (b) subjective perception evaluation obtained by mapping the other sound quality characteristics to a network model of subjective evaluation as output layer data.

13. A method, comprising:
extracting preference data of a user in real time;
determining data characteristics of the preference data;
determining that the data characteristics are associated with artificial damage;
based on a determination that the data characteristics are associated with the artificial damage, training a baseline model by:
  artificially processing original audio data samples of audio databases to obtain lossy audio data samples;
  extracting features of the original audio data samples and the lossy audio data samples respectively to obtain lossy audio data characteristics and original audio data characteristics;
  using the lossy audio data characteristics as input layer data and using the original audio data characteristics as output layer data; and
generating a personalized sound quality characteristic processing model by learning, based on the baseline model, the preference data of the user; and
generating a personalized sound quality characteristic processing result based on the personalized sound quality characteristic processing model,
wherein the baseline model comprises a neural network model.

14. The method of claim 13, wherein the learning the preference data of the user comprises:
outputting sound quality characteristics processing results based on the baseline model, and updating the baseline model to obtain the personalized sound quality characteristics processing model based on feedback data from the user on the sound quality characteristics processing results; or
based on the user's feedback data on the personalized sound quality characteristics processing result, updating the personalized sound characteristic processing model.

15. The method of claim 14, wherein the learning the preference data of the user comprises: if a number of individual user feedback behaviors in user behavior data exceeds a predetermined value, relearning the baseline model or the personalized audio sound quality characteristics processing model based on the preference data of the user.

16. A system, comprising:
an audio playback terminal configured to store user preference data;
a cloud platform configured to:
  determine that data characteristics of the user preference data are associated with artificial damage;
  based on a determination that the data characteristics are associated with the artificial damage, train a baseline model by:
    artificially processing original audio data samples of audio databases to obtain lossy audio data samples;
    extracting features of the original audio data samples and the lossy audio data samples respectively to obtain lossy audio data characteristics and original audio data characteristics;
    using the lossy audio data characteristics as input layer data and using the original audio data characteristics as output layer data,
  wherein the baseline model comprises a neural network model; and
an online learning device configured to receive the user preference data and learn the baseline model online to generate a personalized audio sound quality model.

17. The method of claim 13, wherein the data characteristics comprise one or more of time domain or frequency domain characteristics.

18. The system of claim 16, wherein the data characteristics comprise one or more of time domain or frequency domain characteristics.

19. The system of claim 16, further comprising:
processing, based on the personalized audio sound quality model, audio data.

20. The system of claim 16, wherein the cloud platform is configured to train the baseline model by performing an unsupervised deep learning method on the user preference data.

* * * * *